United States Patent
Takahashi

(10) Patent No.: US 9,740,656 B2
(45) Date of Patent: Aug. 22, 2017

(54) DATA BUS DRIVING CIRCUIT, AND SEMICONDUCTOR DEVICE AND SEMICONDUCTOR MEMORY DEVICE INCLUDING THE SAME

(71) Applicant: Renesas Electronics Corporation, Kawasaki-shi (JP)

(72) Inventor: Hiroyuki Takahashi, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 100 days.

(21) Appl. No.: 14/685,471

(22) Filed: Apr. 13, 2015

(65) Prior Publication Data
US 2015/0309861 A1  Oct. 29, 2015

(30) Foreign Application Priority Data
Apr. 23, 2014  (JP) .................................. 2014-089398

(51) Int. Cl.
| | |
|---|---|
| H03M 13/11 | (2006.01) |
| G06F 13/42 | (2006.01) |
| G06F 11/10 | (2006.01) |
| G11C 7/02 | (2006.01) |
| G11C 7/10 | (2006.01) |
| G11C 11/4093 | (2006.01) |
| G11C 29/52 | (2006.01) |
| G06F 13/40 | (2006.01) |
| G11C 29/04 | (2006.01) |

(52) U.S. Cl.
CPC .......... *G06F 13/4221* (2013.01); *G06F 11/10* (2013.01); *G06F 13/4072* (2013.01); *G06F 13/4234* (2013.01); *G11C 7/02* (2013.01); *G11C 7/1006* (2013.01); *G11C 11/4093* (2013.01); *G11C 29/52* (2013.01); *G11C 2029/0411* (2013.01); *G11C 2207/107* (2013.01); *Y02B 60/1228* (2013.01); *Y02B 60/1235* (2013.01)

(58) Field of Classification Search
CPC ....................................................... H03M 13/11
USPC ................ 714/758, 797, 719, 823, 726, 815
See application file for complete search history.

(56) References Cited

U.S. PATENT DOCUMENTS 5,365,516 A * 11/1994 Jandrell ................ G01S 5/0009
340/991
5,477,492 A * 12/1995 Ohsaki .................... G11C 29/74
365/200

(Continued)

FOREIGN PATENT DOCUMENTS

| JP | 05-334206 A | 12/1993 |
|---|---|---|
| JP | 2005-173860 A | 6/2005 |

*Primary Examiner* — Fritz Alphonse
(74) *Attorney, Agent, or Firm* — McGinn IP Law Group, PLLC.

(57) ABSTRACT

Provided is a data bus driving circuit including: a data processing unit that processes input data and outputs processed data; a first logic inversion unit that selects, based on a determination result signal, one of the processed data and inverted data obtained by logically inverting each value of a plurality of bits constituting the processed data, and outputs the selected data to a data bus; and an inversion determination unit that compares the data output from the first logic inversion unit with the input data that has not been processed by the data processing unit, and outputs the determination result signal based on a comparison result.

20 Claims, 16 Drawing Sheets

(56) References Cited

U.S. PATENT DOCUMENTS

| | | | | |
|---|---|---|---|---|
| 5,841,717 A | * | 11/1998 | Yamaguchi | G11C 11/4096 |
| | | | | 365/194 |
| 8,120,960 B2 | * | 2/2012 | Varkony | G11O 5/145 |
| | | | | 365/185.16 |
| 2004/0012583 A1 | * | 1/2004 | Teshirogi | G09G 3/3611 |
| | | | | 345/204 |
| 2010/0122130 A1 | * | 5/2010 | Moon | G11C 29/1201 |
| | | | | 714/719 |
| 2014/0286087 A1 | * | 9/2014 | Fujita | G11C 11/1673 |
| | | | | 365/158 |

* cited by examiner

RATIO OF NUMBER OF MATCHED BITS BETWEEN
UNPROCESSED DATA AND PROCESSED DATA

| NUMBER OF DATA BITS | 100% | 75% | 50% | 25% |
|---|---|---|---|---|
| 2bit | 75% | 88% | 100% | 113% |
| 4bit | 63% | 75% | 88% | 100% |
| 8bit | 56% | 69% | 81% | 94% |
| 16bit | 53% | 66% | 78% | 91% |
| 64bit | 51% | 63% | 76% | 88% |
| 256bit | 50% | 63% | 75% | 88% |

ASSUMING THAT POWER CONSUMPION IN CASE OF
PERFORMING NO LOGIICAL INVERSION
PROCESSING IS 100%

POWER REDUCTION

Fig. 7

DATA BUS DRIVING CIRCUIT, AND SEMICONDUCTOR DEVICE AND SEMICONDUCTOR MEMORY DEVICE INCLUDING THE SAME

CROSS-REFERENCE TO RELATED APPLICATIONS

This application is based upon and claims the benefit of priority from Japanese patent application No. 2014-089398, filed on Apr. 23, 2014, the disclosure of which is incorporated herein in its entirety by reference.

BACKGROUND

The present invention relates to a data bus driving circuit, and a semiconductor device and a semiconductor device including the data bus driving circuit. In particular, the present invention relates to a data bus driving circuit suitable for reducing power consumption in a data bus without degrading the processing performance, and a semiconductor device and a semiconductor memory device including the data bus driving circuit.

Due to the miniaturization of a process and increase in capacity of memories, data held in memory cells tend to be unstable. Accordingly, in order to improve the reliability of data, the number of memories having an ECC (Error Check and Correct) function for detecting storage of erroneous data and correcting the data has recently been increasing.

In a single memory and an LSI (Large Scale Integration) incorporating a memory, the capacity of the memory and the number of data bits has been increased so as to improve the processing performance of the system. Therefore, the ratio of electric power consumed in a data bus to the entire power consumption has been increasing.

A solution to the above problem is disclosed in Japanese Unexamined Patent Application Publication No. 2005-173860. In a data storage device disclosed in Japanese Unexamined Patent Application Publication No. 2005-173860, whether or not to logically invert each value of bits constituting data including main data and an error correction node is determined so as to obtain a data pattern in which power consumption is reduced during data storage processing, and the data or the inverted data thereof is written into a memory cell array based on the determination result. During data reading, when the data read out from the memory cell array is the inverted data, the inverted data is re-inverted to be restored into the original data. Thus, the current consumption is reduced.

In addition, Japanese Unexamined Patent Application Publication No. H05-334206 discloses a configuration for controlling whether or not to invert the polarity of a bit string constituting transmit data based on a result of a comparison between the transmit data and a bus signal.

SUMMARY

However, in the configuration disclosed in Japanese Unexamined Patent Application Publication No. 2005-173860, a time for data inversion determination processing is required in addition to a time for ECC processing. This causes a problem that the processing performance of the memory is degraded. The time for data inversion determination processing is required in addition to the time for ECC processing not only in the memory, but also in a semiconductor device including a data processing unit that processes data and an inversion determination unit that determines whether or not to logically invert the data processed by the data processing unit during transmission of the data through a data bus. This causes a problem that the processing performance is degraded, as in the case of the memory. Other problems to be solved and novel features of the present invention will become apparent from the following description and the accompanying drawings.

A first aspect of the present invention is a data bus driving circuit including: a data processing unit that processes input data and outputs processed data; a first logic inversion unit that selects, based on a determination result signal, one of the processed data and inverted data obtained by logically inverting each value of a plurality of bits constituting the processed data, and outputs the selected data to a data bus; and an inversion determination unit that compares the data output from the first logic inversion unit with the input data that has not been processed by the data processing unit, and outputs the determination result signal based on a comparison result.

According to the above-mentioned aspect of the invention, it is possible to provide a data bus driving circuit capable of reducing power consumption without degrading the processing performance, and a semiconductor device and a semiconductor memory device including the data bus driving circuit.

BRIEF DESCRIPTION OF THE DRAWINGS

The above and other aspects, advantages and features will be more apparent from the following description of certain embodiments taken in conjunction with the accompanying drawings, in which:

FIG. 7 is a table showing a power reduction effect obtained when the number of data bits and the ratio of data bits for use in inversion determination to all data bits are set;

DETAILED DESCRIPTION

Figure 1:
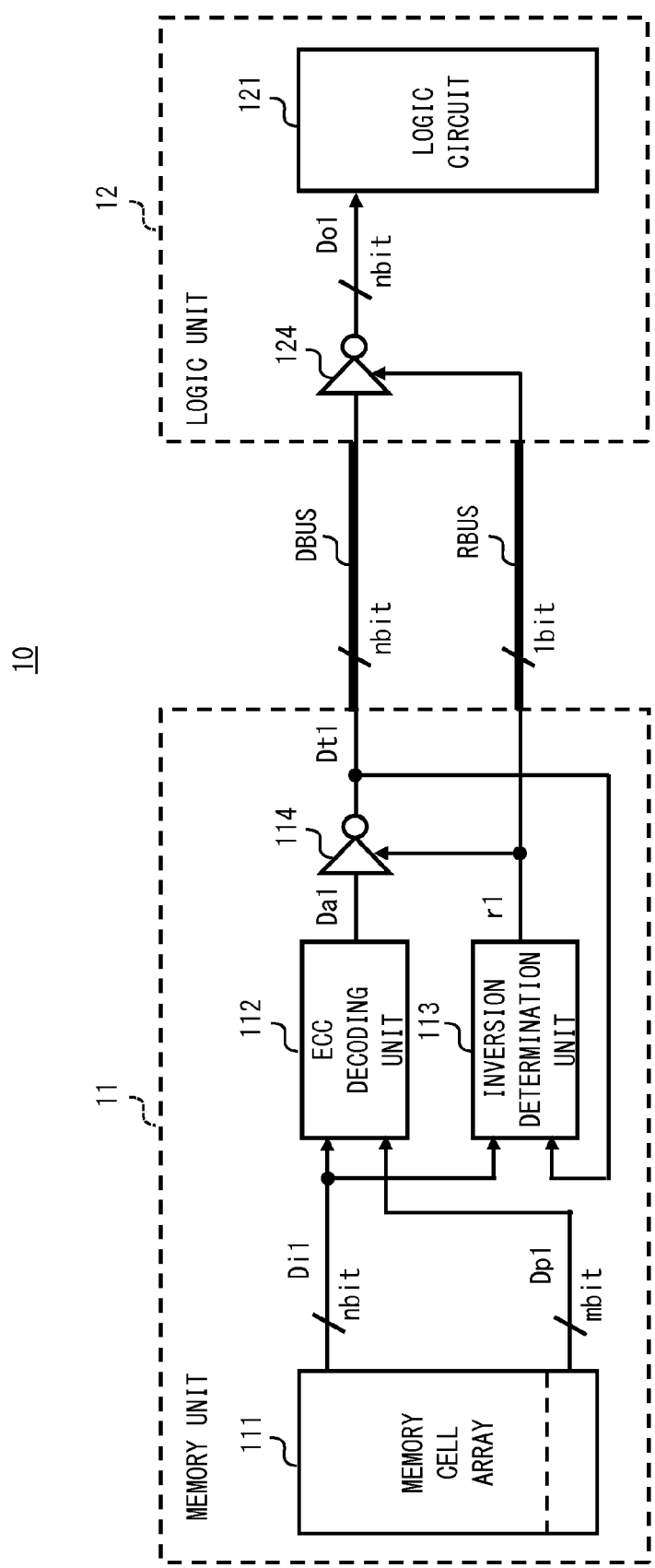
FIG. 1 is a block diagram showing a semiconductor device according to a first embodiment.

Embodiments of the present invention will be described below with reference to the accompanying drawings. Note that the drawings are in simplified form, and the technical scope of the present invention should not be interpreted to be limited to the drawings. The same elements are denoted by the same reference numerals, and a duplicate description is omitted as needed.

In the following embodiments, when necessary, the present invention is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used.

Further, in the following embodiments, the components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the like that are substantially similar to or resemble that shape are also included in that shape except for cases where it is explicitly specified or they are eliminated based on its principle. This is also true for the above-described number or the like (including numbers, values, quantities, ranges, and the like).

<First Embodiment>

FIG. 1 is a block diagram showing a semiconductor device 10 according to a first embodiment. In the case of reading data from a memory unit, the semiconductor device 10 performs processing for determining whether or not to invert data to be transmitted to a data bus, by using data which has not been processed by an ECC decoding unit. With this configuration, the ECC processing performed by the ECC decoding unit and the processing for determining whether or not to invert the data to be transmitted to the data bus can be executed in parallel, thereby making it possible to reduce power consumption without degrading the processing performance. The configuration will be described in detail below.

As shown in FIG. 1, the semiconductor device 10 includes: a memory unit 11 from which data is read and to which data is written; a logic unit 12 that exchanges data with the memory unit 11; and buses DBUS and RBUS that connect the memory unit 11 and the logic unit 12 to each other. The bus DBUS is a bus through which data read out from the memory unit 11 and data to be written into the memory unit 11 propagate. The bus RBUS is a bus through which a determination result signal, which is described later, propagates. FIG. 1 illustrates only the components associated with the data reading operation of the memory unit 11.

The memory unit 11 includes a memory cell array 111, an ECC decoding unit 112, an inversion determination unit 113, and a logic inversion unit 114. Examples of the memory unit 11 include a DRAM, an SRAM, a ROM, and various types of non-volatile memories. The ECC decoding unit 112, the inversion determination unit 113, and the logic inversion unit 114 constitute a data bus driving circuit.

The memory cell array 111 includes a plurality of memory cells arranged in a matrix. The memory cell array 111 stores main data and an error correction code (for example, hamming code or parity data) which is calculated based on the main data.

The ECC decoding unit 112 performs error correction processing, based on an error correction code Dp1, on data Di1 read out from the memory cell array 111, and outputs corrected data Da1. The data Di1 and the Da1 are data having an n (n is an integer equal to or greater than 2)-bit width. The error correction code Dp1 is a code having an m (m is an integer equal to or greater than 1)-bit width.

The logic inversion unit 114 outputs, to the data bus DBUS, the data Da1 or the inverted data thereof as data Dt1 based on a determination result signal r1. The inverted data of the data Da1 is data obtained by logically inverting each value of a plurality of bits constituting the data Da1. The data Dt1 is data having an n-bit width. The data bus DBUS is a bus having an n-bit width.

The inversion determination unit 113 compares the data Di1, which has not been processed by the ECC decoding unit 112, with the data Dt1 which is output from the logic inversion unit 114 and is provided one cycle before the data propagates through the data bus DBUS, and outputs the determination result signal r1 according to the comparison result. The determination result signal r1 is a signal having a 1-bit width and representing a logical value 0 or 1.

Specifically, the inversion determination unit 113 compares each value of n bits constituting the data Di1 with each value of n bits constituting the data Dt1. When the number of bits representing different logical values is greater than the number of bits representing the same logical value, the inversion determination unit 113 outputs the determination result signal r1 to cause the logic inversion unit 114 to invert the data Da1 and output the inverted data as the data Dt1.

The logic unit 12 includes a logic circuit 121 and a logic inversion unit 124.

The logic inversion unit 124 outputs the data Dt1, which is transmitted from the memory unit 11 through the data bus DBUS, or the inverted data of the data Dt1, as data Do1, based on the determination result signal r1 transmitted from the memory unit 11 through the bus RBUS.

The logic circuit 121 receives the data Do1 output from the logic inversion unit 124 and executes predetermined processing.

For example, the inversion determination unit 113 compares each value of n bits constituting the data Di1 with each value of n bits constituting the data Dt1. When the number of bits representing different logical values is greater than the number of bits representing the same logical value, the inversion determination unit 113 outputs the H-level determination result signal r1. In the other cases, the inversion determination unit 113 outputs the L-level determination result signal r1. When the H-level determination result signal r1 is output, the logic inversion unit 114 inverts the data Da1 and outputs the inverted data as the data Dt1, and the logic inversion unit 124 re-inverts the data Dt1 and outputs the re-inverted data as the data Do1 (restores the data Da1). On the other hand, when the L-level determination result signal r1 is output, the logic inversion unit 114 directly outputs the data Da1 as the data Dt1, and the logic inversion unit 124 directly outputs the data Dt1 as the data Do1. Thus, a change in each value of n bits constituting the data Dt1 in association with the transition of the read data can be constantly suppressed to half or less. This leads to a reduction in power consumption. Further, since the bus RBUS has a 1-bit width, the effect of power consumption in the bus RBUS decreases to a negligible level as the bit width of the data bus DBUS increases.

In this case, the inversion determination unit 113 determines whether or not to cause the logic inversion unit 114 to invert the data Da1, by using the data Di1 which has not been processed by the ECC decoding unit 112. In other words, the inversion determination unit 113 executes processing in parallel with the ECC decoding unit 112, without waiting for the processing result from the ECC decoding unit 112. Consequently, the power consumption can be reduced without degrading the processing performance, unlike in the case where the inversion determination unit 113 executes processing after waiting for the processing result from the ECC decoding unit 112.

There is a possibility that the data Di1, which has not been processed by the ECC decoding unit 112, includes error bits. However, the frequency at which the data Di1 includes error bits and the number of error bits are negligibly small. Therefore, such error bits have little effect on the determination as to whether or not to invert the data Da1.

In this manner, the semiconductor device 10 performs processing for determining whether or not to invert the data to be transmitted to the data bus DBUS, by using the data which has not been processed by the ECC decoding unit 112. Thus, the ECC processing by the ECC decoding unit and the processing for determining whether or not to invert the data to be transmitted to the data bus can be executed in parallel, thereby making it possible to reduce power consumption without degrading the processing performance (processing speed).

A peak current for charging and discharging can be reduced by reducing the transition of the data to be transmitted to the data bus DBUS with a large load. This leads to a reduction in power supply noise.

Furthermore, since the ECC decoding unit 112 performs processing in the memory unit 11, there is no need to provide any data bus through which the error correction code propagates. Therefore, an increase in electric power consumed in the data bus can be suppressed and an increase in the circuit size can be suppressed.

Figure 2:
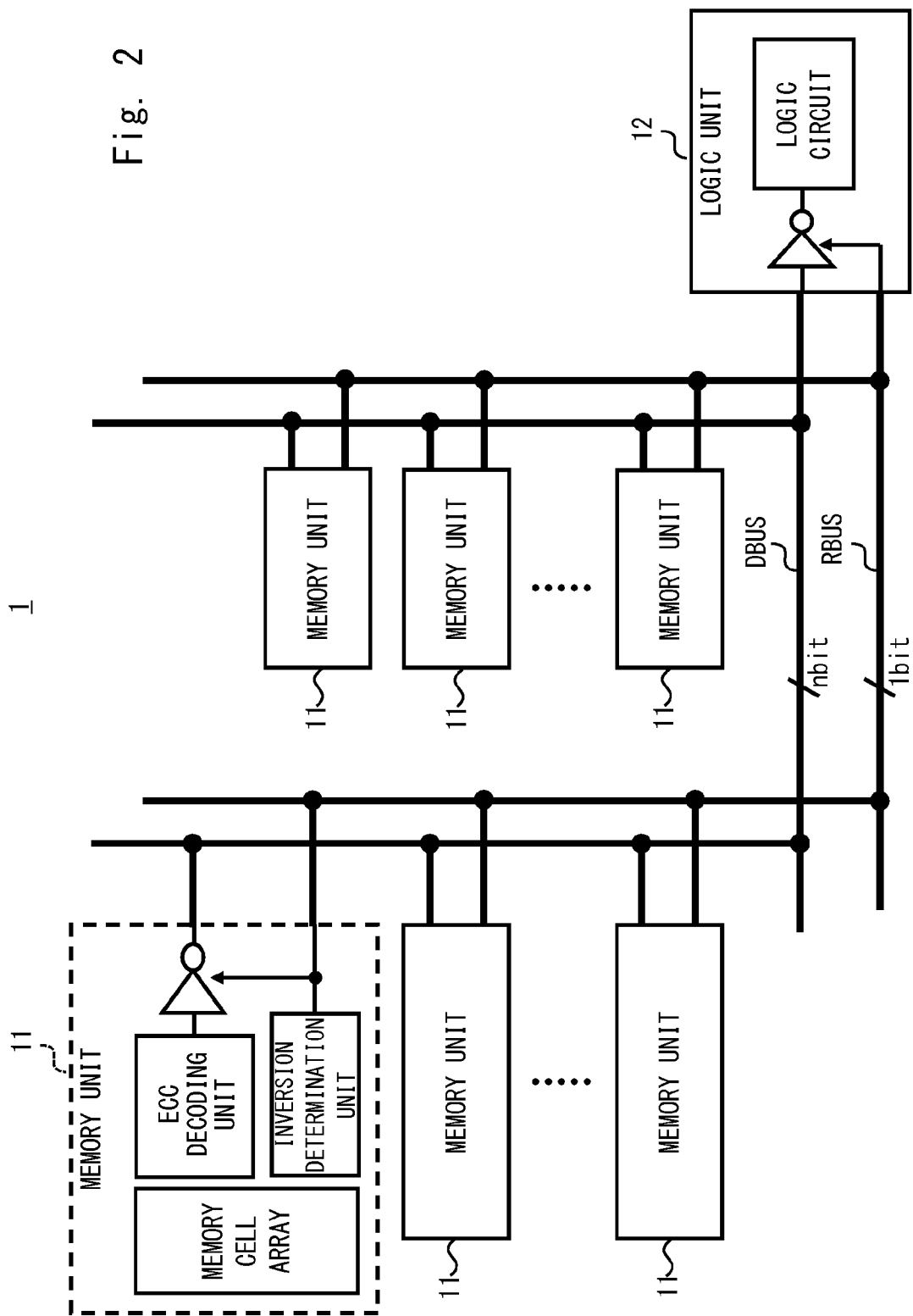
FIG. 2 is a block diagram showing an LSI system to which the semiconductor device shown in FIG. 1 is applied.

FIG. 2 is a block diagram showing an LSI system 1 to which the semiconductor device 10 is applied.

As shown in FIG. 2, the LSI system 1 includes a plurality of memory units 11, the logic unit 12, and the buses DBUS and RBUS that connect the plurality of memory units 11 and the logic unit 12 to each other. In other words, the LSI system 1 is equivalent to the semiconductor device 10 including the plurality of memory units 11.

In this case, the plurality of memory units 11 are formed by dividing a large-scale memory into a plurality of areas. Among the plurality of memory units 11, only the memory units 11 from which data is read can be activated and the other memory units can be kept in the non-activated state. This configuration makes it possible to reduce the power consumption in the entire memory.

However, as a result of dividing a large-scale memory into a plurality of areas, the length of the data bus DBUS that connects the logic unit 12 with the plurality of memory units 11 increases, which results in an increase in load capacity. Accordingly, the ratio of electric power consumed in the data bus is further increased as the number of data bits increases.

In view of the above, the structure of the semiconductor device 10 is applied to the LSI system 1 so that the power consumption can be reduced without degrading the processing performance.

<Second Embodiment>

Figure 3:
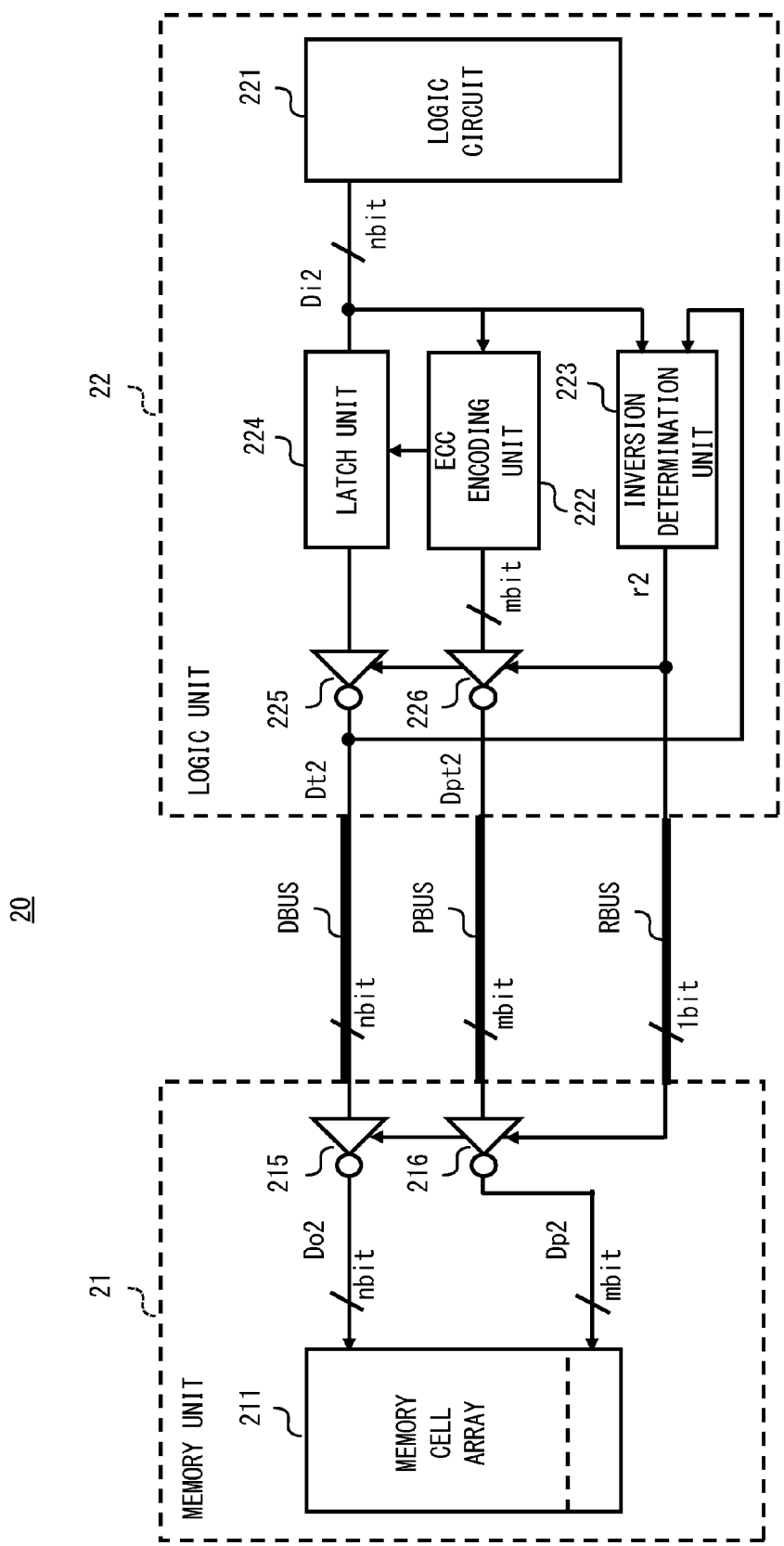
FIG. 3 is a block diagram showing a semiconductor device according to a second embodiment.

FIG. 3 is a block diagram showing a semiconductor device 20 according to a second embodiment. In the case of writing data into a memory unit from a logic unit, the semiconductor device 20 performs processing for determining whether or not to invert data to be transmitted to a data bus, by using data which has not been processed by an ECC encoding unit. With this configuration, the processing performed by the ECC encoding unit and the processing for determining whether or not to invert the data to be transmitted to the data bus can be executed in parallel, thereby making it possible to reduce the power consumption without degrading the processing performance. This configuration will be described in detail below.

As shown in FIG. 3, the semiconductor device 20 includes a memory unit 21, a logic unit 22, and buses DBUS, PBUS, and RBUS that connect the memory unit 21 and the logic unit 22 to each other. The memory unit 21 and the logic unit 22 correspond to the memory unit 11 and the logic unit 12, respectively. The data bus PBUS is a bus through which an error correction code propagates. FIG. 3 illustrates only the components associated with the data writing operation of the memory unit 21.

The logic unit 22 includes a logic circuit 221, an ECC encoding unit 222, a latch unit 224, an inversion determination unit 223, and logic inversion units 225 and 226. The logic circuit 221 corresponds to the logic circuit 121. The ECC encoding unit 222, the latch unit 224, the inversion determination unit 223, and the logic inversion units 225 and 226 constitute a data bus driving circuit.

The logic circuit 221 outputs data Di2 to be written into the memory unit 21. The data Di2 is data having an n-bit width.

The ECC encoding unit 222 calculates an error correction code Dp2 based on the data Di2 and outputs the calculated error correction code Dp2. The error correction code Dp2 is a code having an m-bit width.

The latch unit 224 operates in synchronization with a clock signal. Upon completion of the coding processing by the ECC encoding unit 222, the latch unit 224 outputs the data Di2 to the logic inversion unit 225 in a subsequent stage. The latch unit 224 and the logic inversion unit 225 may constitute one latch unit.

The logic inversion unit 225 outputs, to the data bus DBUS, the data Di2 or the inverted data thereof based on a determination result signal r2 which is described later. The logic inversion unit 226 outputs, to the data bus PBUS, the error correction code Dp2 or the inverted data thereof as data Dpt2 based on the determination result signal r2. The data bus PBUS is a bus having an m-bit width.

The inversion determination unit 223 compares the data Di2, which has not been processed by the ECC encoding unit 222, with data Dt2 which is output from the logic inversion unit 225 and is provided one cycle before the data propagates through the data bus DBUS, and outputs the determination result signal r2 according to the comparison result. The determination result signal r2 is a signal having a 1-bit width and representing a logical value 0 or 1.

Specifically, the inversion determination unit 223 compares each value of n bits constituting the data Di2 with each value of n bits constituting the data Dt2. When the number of bits representing different logical values is greater than the number of bits representing the same logical value, the inversion determination unit 223 outputs the determination result signal r2 to cause the logic inversion unit 225 to invert the data Di2 and output the inverted data as the data Dt2, and to cause the logic inversion unit 225 to invert the error correction code Dp2 and output the inverted code as the data Dpt2.

The memory unit 21 includes a memory cell array 211 and logic inversion units 215 and 216. The memory cell array 211 corresponds to the memory cell array 111.

The logic inversion unit 215 outputs, as data Do2, the data Dt2, which is transmitted from the logic unit 22 through the data bus DBUS, or the inverted data of the data Dt2, based on the determination result signal r2 transmitted from the logic unit 22 through the bus RBUS.

The logic inversion unit 216 outputs the data Dpt2, which is transmitted from the logic unit 22 through the data bus PBUS, or the inverted data of the data Dpt2, as the error correction code Dp2, based on the determination result signal r2 transmitted from the logic unit 22 through the bus RBUS.

The data Do2 and the error correction code Dp2, which are output from the logic inversion units 215 and 216, respectively, are written into the memory cell array 211.

For example, the inversion determination unit 223 compares each value of n bits constituting the data Di2 with each value of n bits constituting the data Dt2. When the number of bits representing different logical values is greater than the number of bits representing the same logical value, the inversion determination unit 223 outputs the H-level determination result signal r2. In the other cases, the inversion determination unit 223 outputs the L-level determination result signal r2. When the H-level determination result signal r2 is output, the logic inversion unit 225 inverts the data Di2 and outputs the inverted data as the data Dt2, and the logic inversion unit 215 re-inverts the data Dt2 and outputs the re-inverted data as the data Do2 (restores the data Di2). On the other hand, when the L-level determination result signal r2 is output, the logic inversion unit 225 directly outputs the data Di2 as the data Dt2, and the logic inversion unit 215 directly outputs the data Dt2 as the data Do2. Thus, a change in each value of n bits constituting the data Dt2 in association with the transition of the data to be written can be constantly suppressed to half or less. This leads to a reduction in power consumption. Further, since the bus RBUS has a 1-bit width, the effect of power consumption in the bus RBUS decreases to a negligible level as the bit width of the data bus DBUS increases.

In this case, the inversion determination unit 223 determines whether or not to cause the logic inversion unit 225 to invert the data Di2, by using the data Di2 which has not been processed by the ECC encoding unit 222 (and the latch unit 224). In other words, the inversion determination unit 223 executes processing in parallel with the ECC encoding unit 222 (and the latch unit 224), without waiting for the processing result from the ECC encoding unit 222 (and the latch unit 224). Consequently, the power consumption can be reduced without degrading the processing performance, unlike in the case where the inversion determination unit 223 executes processing after waiting for the processing result from the ECC encoding unit 222 (and the latch unit 224).

The inversion determination unit 223 does not make a determination as to whether or not to invert the error correction code Dp2 generated in the ECC encoding unit 222. However, since n>m holds in general, the error in the inversion determination of a data set (write data +error correction code) is small. When the number n of bits of the data Di2 increases, the ratio m/n of the number m of bits of the error correction code Dp2 decreases. Accordingly, the error in the inversion determination of the data set decreases as the number n of bits of the data Di2 increases. That is, the power consumption can be more effectively reduced. Furthermore, the inversion determination unit 223 does not make a determination as to whether or not to invert the error correction code Dp2, and makes only the determination as to whether or not to invert the data Di2. Therefore, the determination processing speed can be improved as compared with the case where the determination as to whether or not to invert the error correction code Dp2 and the determination as to whether or not to invert the data Di2 are performed.

In this manner, the semiconductor device 20 performs processing for determining whether or not to invert the data to be transmitted to the data bus DBUS, by using the data which has not been processed by the ECC encoding unit 222 (and the latch unit 224). With this configuration, the processing performed by the ECC encoding unit 222 (and the latch unit 224) and the processing for determining whether or not to invert the data to be transmitted to the data bus can be executed in parallel, thereby making it possible to reduce power consumption without degrading the processing performance (processing speed).

Furthermore, a peak current for charging and discharging can be reduced by reducing the transition of the data to be transmitted to the data bus DBUS with a large load. This leads to a reduction in power supply noise.

While FIG. 3 illustrates the case where the logic inversion units 216 and 226 are each provided on the path through which the error correction code propagates, the configuration of the logic inversion units 216 and 226 is not limited thereto. Since the inversion determination unit 323 does not make a determination as to whether or not to invert the error correction code, the logic inversion units 216 and 226 need not necessarily be provided.

Figure 4:
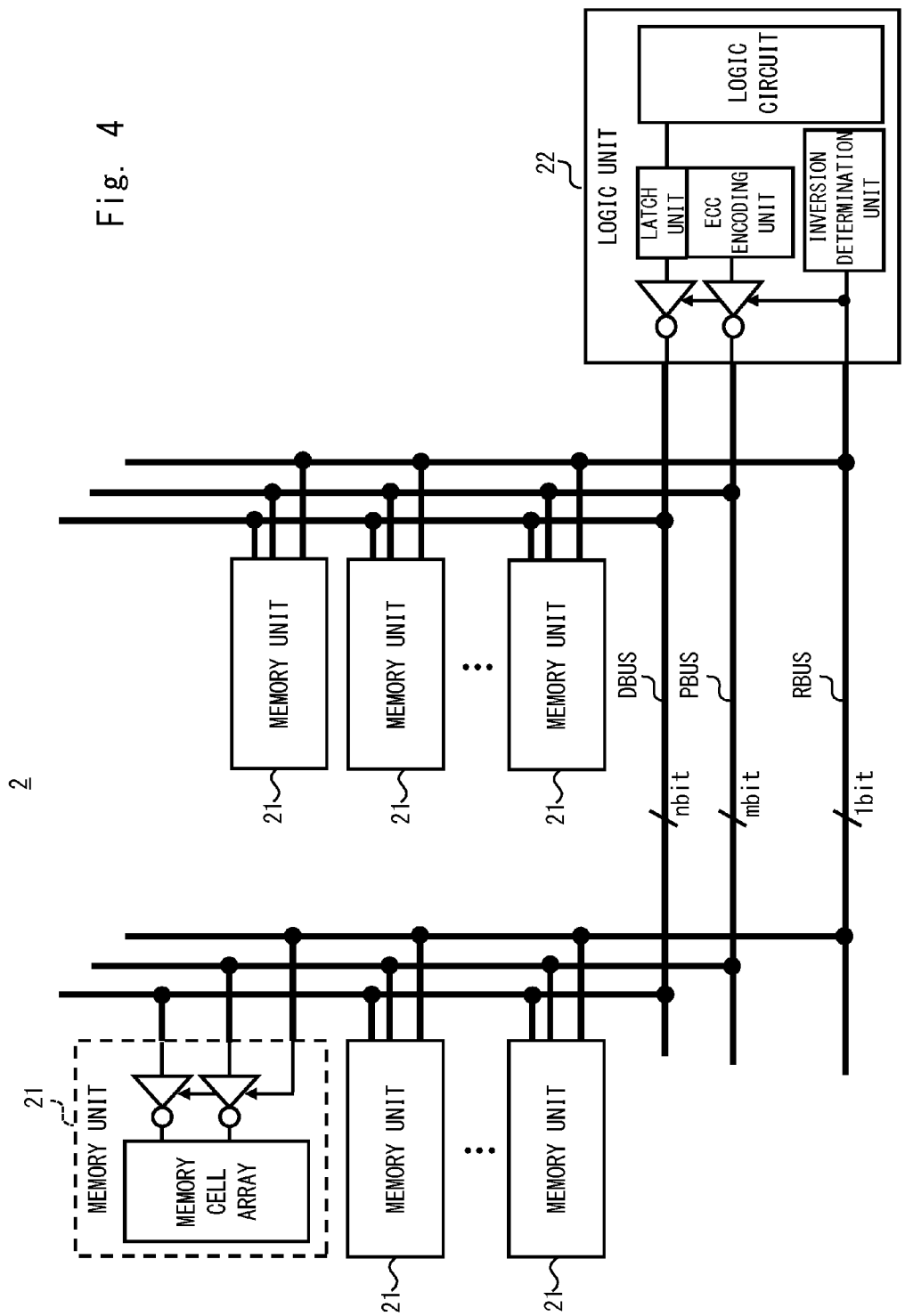
FIG. 4 is a block diagram showing an LSI system to which the semiconductor device shown in FIG. 3 is applied.

FIG. 4 is a block diagram showing an LSI system 2 to which the semiconductor device 20 is applied.

As shown in FIG. 4, the LSI system 2 includes a plurality of memory units 21, the logic unit 22, and the data buses DBUS and RBUS that connect the plurality of memory units 21 and the logic unit 22 to each other. In other words, the LSI system 2 is equivalent to the semiconductor device 20 including the plurality of memory units 21.

In this case, the plurality of memory units 21 are formed by dividing a large-size memory into a plurality of areas. Among the plurality of memory units 21, only the memory units 21 to which data is written can be activated and the other memory units can be kept in the non-activated state. This configuration makes it possible to reduce the power consumption in the entire memory.

However, as a result of dividing a large-scale memory into a plurality of areas, the length of the data bus DBUS that connects the logic unit 22 with the plurality of memory units 21 increases, which results in an increase in load capacity. Accordingly, the ratio of electric power consumed in the data bus is further increased as the number of data bits increases.

In view of the above, the structure of the semiconductor device 20 is applied to the LSI system 2 so that the power consumption can be reduced without degrading the processing performance.

There is no need to incorporate the ECC encoding unit 222 in each of the plurality of memory units 21, as long as one ECC encoding unit 222 is provided in the logic unit 22. Accordingly, an increase in the circuit size can be suppressed.

Next, the cases in which the semiconductor devices 10 and 20 are applied will be described.

For example, in a cache memory of a CPU in which the ratio of data reading operation is high, the structure of the semiconductor device 10 is applied to the configuration associated with the data reading operation. Thus, in the data reading operation, the power consumption can be reduced without degrading the processing performance. On the other hand, in the configuration associated with the data writing operation, the ECC encoding unit is provided not in the logic unit, but in the memory unit. As a result, the bus PBUS through which the error correction code propagates during the data writing operation can be omitted.

For example, in an image buffer, the ratio of data reading operation and the ratio of data writing operation are substantially the same. However, generally, in the case of a memory, the amount of power consumption during the data writing operation tends to be larger than the amount of power consumption during the data reading operation. Accordingly, in the image buffer, the structure of the semiconductor device 20 is applied to the configuration associated with the data writing operation. Thus, in the data writing operation, the power consumption can be reduced without degrading the processing performance. On the other hand, in the configuration associated with the data reading operation, the ECC decoding unit is provided not in the memory unit, but in the logic unit. This configuration makes it possible to reduce the circuit area of the memory unit, leading to a reduction in cost.

At this time, the effect of reducing the circuit area or the number of buses varies depending on chip design conditions. However, the high-speed performance, power reduction, and cost reduction can be achieved according to the memory specification and the application environment.

Since the DRAM requires periodic refreshing, the incorporation of the ECC decoding unit and the ECC encoding unit has an effect of improving the reliability of data and increasing a cell data retention period (improving hold characteristics). This effect reduces the frequency of refreshing, which leads to a reduction in standby current. In this case, since the memory cell area of the DRAM is small, the DRAM is often used to achieve a large-scale memory structure. Accordingly, in the DRAM, problems in association with the achievement of the large-scale memory, such as a delay in speed, an increase in refreshing current, and an increase in active current during data writing and reading are liable to occur. Therefore, it is especially effective to apply the structures of the semiconductor devices 10 and 20 to the DRAM.

<Third Embodiment>

Figure 5:
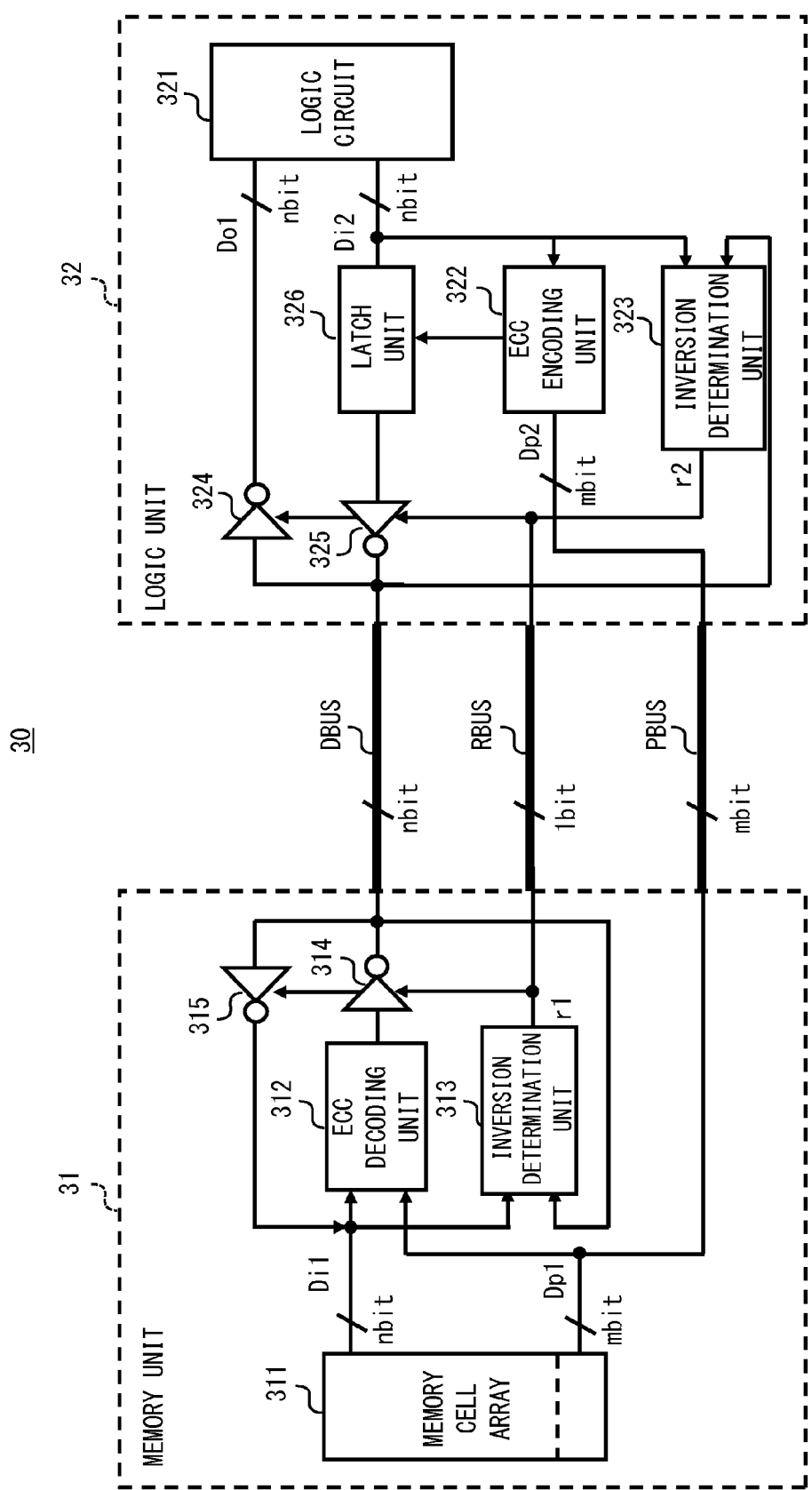
FIG. 5 is a block diagram showing a semiconductor device according to a third embodiment.

FIG. 5 is a block diagram showing a semiconductor device 30 according to a third embodiment. The semiconductor device 30 includes the structures of the semiconductor devices 10 and 20.

As shown in FIG. 5, the semiconductor device 30 includes a memory unit 31, a logic unit 32, and the buses DBUS, PBUS, and RBUS that connect the memory unit 31 and the logic unit 32 to each other. The memory unit 31 and the logic unit 32 correspond to the memory unit 11 and the logic unit 12, respectively. Each of the buses DBUS, PBUS, and RBUS is a two-way bus used for both the data reading operation and the data writing operation.

The memory unit 31 includes a memory cell array 311, an ECC decoding unit 312, an inversion determination unit 313, and logic inversion units 314 and 315. The memory cell array 311, the ECC decoding unit 312, the inversion determination unit 313, and the logic inversion units 314 and 315 respectively correspond to the memory cell array 111, the ECC decoding unit 112, the inversion determination unit 113, and the logic inversion units 114 and 215.

Specifically, as compared with the memory unit 11, the memory unit 31 further includes a signal path through which the write data to be supplied through the data bus DBUS is transmitted to the memory cell array 311, the logic inversion unit 315 provided on the signal path, and a signal path through which the error correction code to be supplied through the data bus PBUS is transmitted to the memory cell array 311. The other components of the memory unit 31 are similar to those of the memory unit 11, and thus the description thereof is omitted.

The logic unit 32 includes a logic circuit 321, an ECC encoding unit 322, a latch unit 326, an inversion determination unit 323, and logic inversion units 324 and 325. The logic circuit 321, the ECC encoding unit 322, the latch unit 326, the inversion determination unit 323, and the logic inversion units 324 and 325 respectively correspond to the logic circuit 221, the ECC encoding unit 222, the latch unit 224, the inversion determination unit 223, and the logic inversion units 124 and 225.

Specifically, as compared with the logic unit 22, the logic unit 32 further includes a signal path through which the read data to be supplied through the data bus DBUS is transmitted to the logic circuit 321, and the logic inversion unit 324 provided on the signal path. The other components of the logic unit 32 are similar to those of the logic unit 22, and thus the description thereof is omitted.

The semiconductor device 30 provides the same effects as those of the semiconductor devices 10 and 20. Furthermore, in the semiconductor device 30, the data buses are used for both the data reading operation and the data writing operation. This leads to a reduction in the number of buses.

21 Fourth Embodiment>

Figure 6:
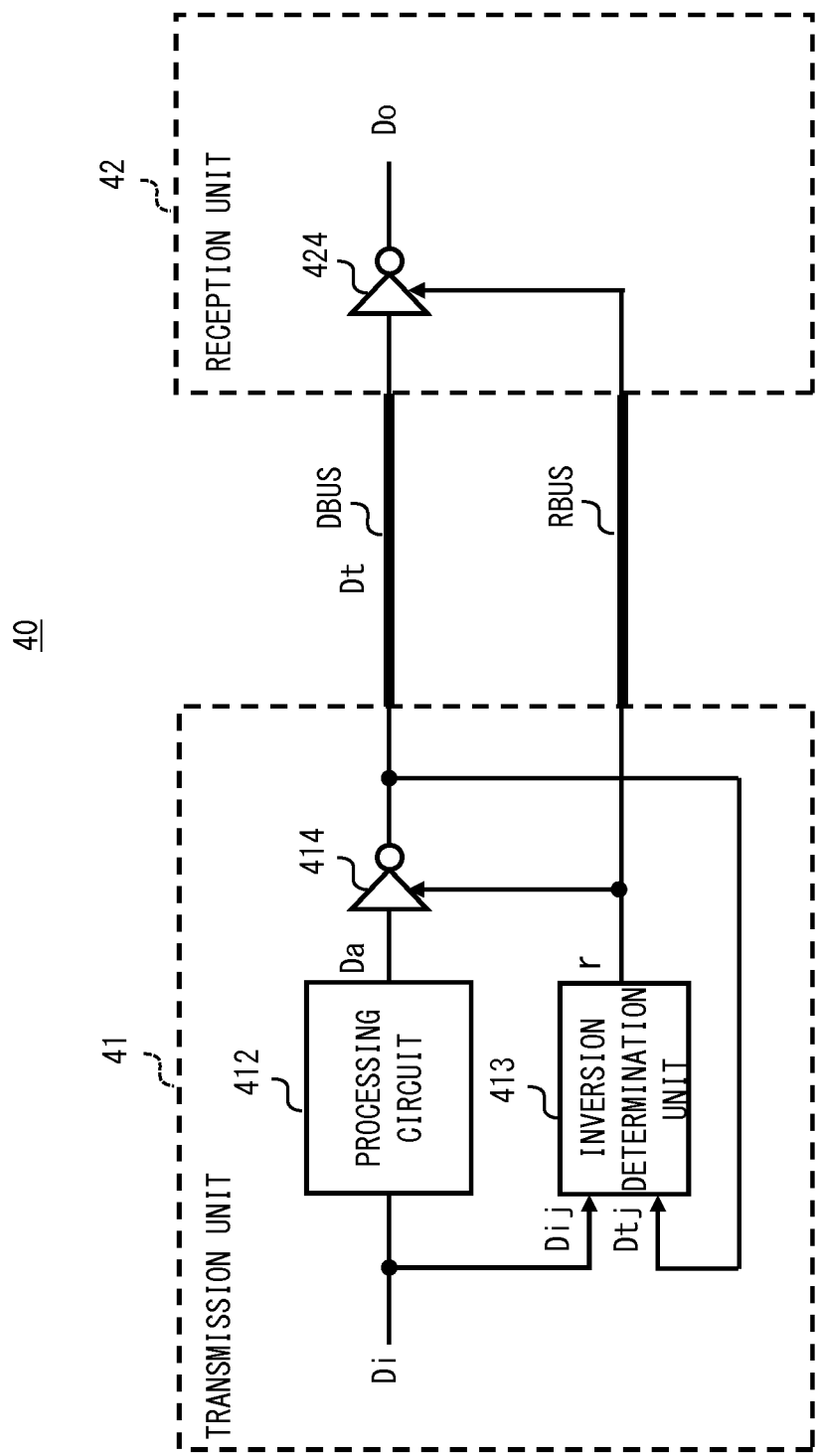
FIG. 6 is a block diagram showing a semiconductor device according to a fourth embodiment.

FIG. 6 is a block diagram showing a semiconductor device 40 according to a fourth embodiment. The semiconductor device 40 is obtained by changing the semiconductor devices 10 and 20 and the like into a more general form.

As shown in FIG. 6, the semiconductor device 40 includes a transmission unit 41, a reception unit 42, and the buses DBUS and RBUS that connect the transmission unit 41 and the reception unit 42 to each other. The transmission unit 41 includes a processing circuit (data processing unit) 411, a logic inversion unit (first logic inversion unit) 414, and an inversion determination unit 413. The reception unit 42 includes a logic inversion unit (second logic inversion unit) 424. For example, the processing circuit 412, the inversion determination unit 413, and the logic inversion units 414 and 424 respectively correspond to the ECC decoding unit 112, the inversion determination unit 113, and the logic inversion units 114 and 124 which are shown in FIG. 1.

The processing circuit 412 processes an input data set Di and outputs processed data Da. The logic inversion unit 414 outputs data Da or the inverted data thereof as data Dt to the data bus DBUS based on a determination result signal r. The logic inversion unit 424 outputs the data Dt, which is transmitted through the data bus DBUS, or the inverted data of the data Dt as data Do based on the determination result signal r.

The inversion determination unit 413 compares data Dij (part or the whole of the data Di), which has not been processed by the processing circuit 412, with data Dtj (part or the whole of the data Dt) which is output from the logic inversion unit 414 and is provided one cycle before the data propagates through the data bus DBUS, and outputs the determination result signal r according to the comparison result.

For example, the inversion determination unit 413 compares each value of n bits constituting the data Dij with each value of n bits constituting the data Dtj. When the number of bits representing different logical values is greater than the number of bits representing the same logical value, the inversion determination unit 413 outputs the H-level determination result signal r. In the other cases, the inversion determination unit 413 outputs the L-level determination result signal r. When the H-level determination result signal r is output, the logic inversion unit 414 inverts the data Da and outputs the inverted data as the data Dt, and the logic inversion unit 424 re-inverts the data Dt and outputs the re-inverted data as the data Do (restores the data Da). On the other hand, when the L-level determination result signal r is output, the logic inversion unit 414 directly outputs the data Di as the data Dt, and the logic inversion unit 424 directly outputs the data Dt as the data Do. Thus, a change in each value of n bits constituting the data Dt in association with the transition of the data to be transmitted can be constantly suppressed to half or less. This leads to a reduction in power consumption. Further, since the bus RBUS has a 1-bit width, the effect of power consumption in the bus RBUS decreases to a negligible level as the bit width of the data bus DBUS increases.

In this case, the inversion determination unit 413 determines whether or not to cause the logic inversion unit 414 to invert the data Da, by using the data Dij which has not been processed by the processing circuit 412. In other words, the inversion determination unit 43 executes processing in parallel with the processing circuit 412, without waiting for the processing result from the processing circuit 412. Therefore, the power consumption can be reduced without degrading the processing performance, unlike in the case where the inversion determination unit 413 executes processing after waiting for the processing result from the processing circuit 412.

There is a possibility that the data Di which has not been processed by the processing circuit 412 does not completely match the processed data Da. However, if the frequency at which the data do not completely match and the number of data bits are small, this has little effect on the determination as to whether or not to invert the data Da.

FIG. 7 is a table showing a power reduction effect obtained when the number of data bits and the ratio of the number of matched bits between data obtained before and after the processing performed by the processing circuit 412 are set. For example, as the error in the data obtained before and after the processing performed by the processing circuit 412 is small, the ratio of the number of matched bits between data obtained before and after the processing performed by the processing circuit 412 increases. On the other hand, the ratio of the number of matched bits between data obtained before and after the processing performed by the processing circuit 412 decreases in accordance with an increase in the error in the data obtained before and after the processing performed by the processing circuit 412. In this embodiment, the ratio (%) of power consumption in the data bus under each condition is illustrated assuming that the power consumption in the data bus in the case where no logical inversion processing is carried out is 100%.

As shown in FIG. 7, as the number of data bits increases, the power consumption in the data bus decreases (the power reduction effect is improved). As the ratio of the number of matched bits between data obtained before and after the processing performed by the processing circuit 412 increases (i.e., as the error in the data obtained before and after the processing performed by the processing circuit 412 decreases), the power consumption in the data bus decreases.

For example, assuming that the electric power consumed in the inversion determination unit 413 is about 10 to 15%, the power consumption in the data bus DBUS is preferably 85% or less. In practice, the number of bits is equal to or more than eight bits. In consideration of the above, it is obvious that the power reduction effect can be obtained when the ratio of the number of matched bits between data before and after the processing performed by the processing circuit 412 is 50% or more. Specifically, it is obvious that the power reduction effect can be obtained when the error in the data obtained before and after the processing performed by the ECC decoding unit 112 is 50% or less.

Thus, in the semiconductor device 40, the inversion determination unit 413 performs the inversion determination processing using the data, which has not been processed by the processing circuit 412, without waiting for the processing result from the processing circuit 412. With this configuration, the processing performed by the processing circuit 412 and the processing performed by the inversion determination unit 413 can be executed in parallel, thereby making it possible to reduce power consumption without degrading the processing performance (processing speed).

The semiconductor devices 10 and 20 are specific examples of the semiconductor device 40. Other specific configuration examples of the semiconductor device 40 will be described in the following embodiments.

<Fifth Embodiment>

Figure 8:
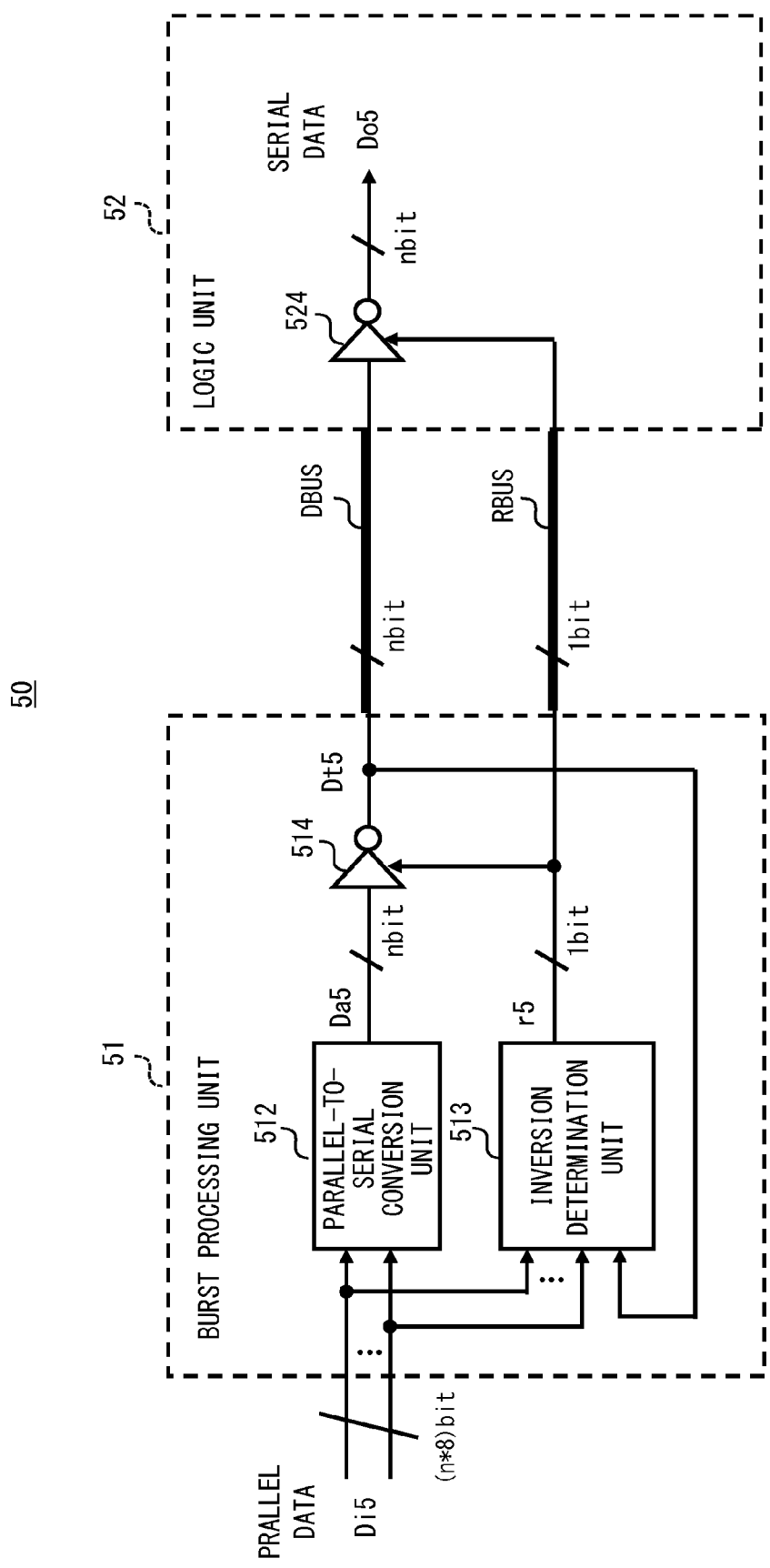
FIG. 8 is a block diagram showing a semiconductor device according to a fifth embodiment.

FIG. 8 is a block diagram showing a semiconductor device 50 according to a fifth embodiment. The semiconductor device 50 is a specific configuration example of the semiconductor device 40.

As shown in FIG. 8, the semiconductor device 50 includes a burst processing unit 51, a logic unit 52, and the buses DBUS and RBUS that connect the burst processing unit 51 and the logic unit 52 to each other.

The burst processing unit 51 includes a parallel-to-serial conversion unit 512, an inversion determination unit 513, and a logic inversion unit 514.

The parallel-to-serial conversion unit 512 converts n×8-bit parallel data Di5 into n-bit serial data Da5. The parallel data Di5 is formed of n-bit burst data Di50 to Di57. The serial data Da5 is formed of n-bit burst data Da50 to Da57 which are sequentially arranged in a serial format.

The logic inversion unit 514 outputs the serial data Da5 or the inverted data thereof as data Dt5 to the data bus DBUS based on a determination result signal r5 from the inversion determination unit 513.

The inversion determination unit 513 compares a part (for example, the burst data Di50) of the parallel data Di5, which has not been processed by the parallel-to-serial conversion unit 512, with burst data (for example, last burst data Dt57 of the previous serial data Dt5) which is output from the logic inversion unit 514 and propagates through the data bus DBUS, and outputs the determination result signal r5 according to the comparison result. The determination result signal r5 is a signal having a 1-bit width and representing a logical value 0 or 1. The determination result signal r5 is formed of determination result signals r50 to r57, which correspond to the burst data Da50 to Da57, respectively, and are sequentially arranged in a serial format.

The logic unit 52 includes a logic inversion unit 524. The logic inversion unit 524 outputs the data Dt5, which is transmitted from the burst processing unit 51 through the data bus DBUS, or the inverted data of the data Dt5, as data Do5, based on the determination result signal r5 transmitted from the burst processing unit 51 through the data bus RBUS.

Figure 9:
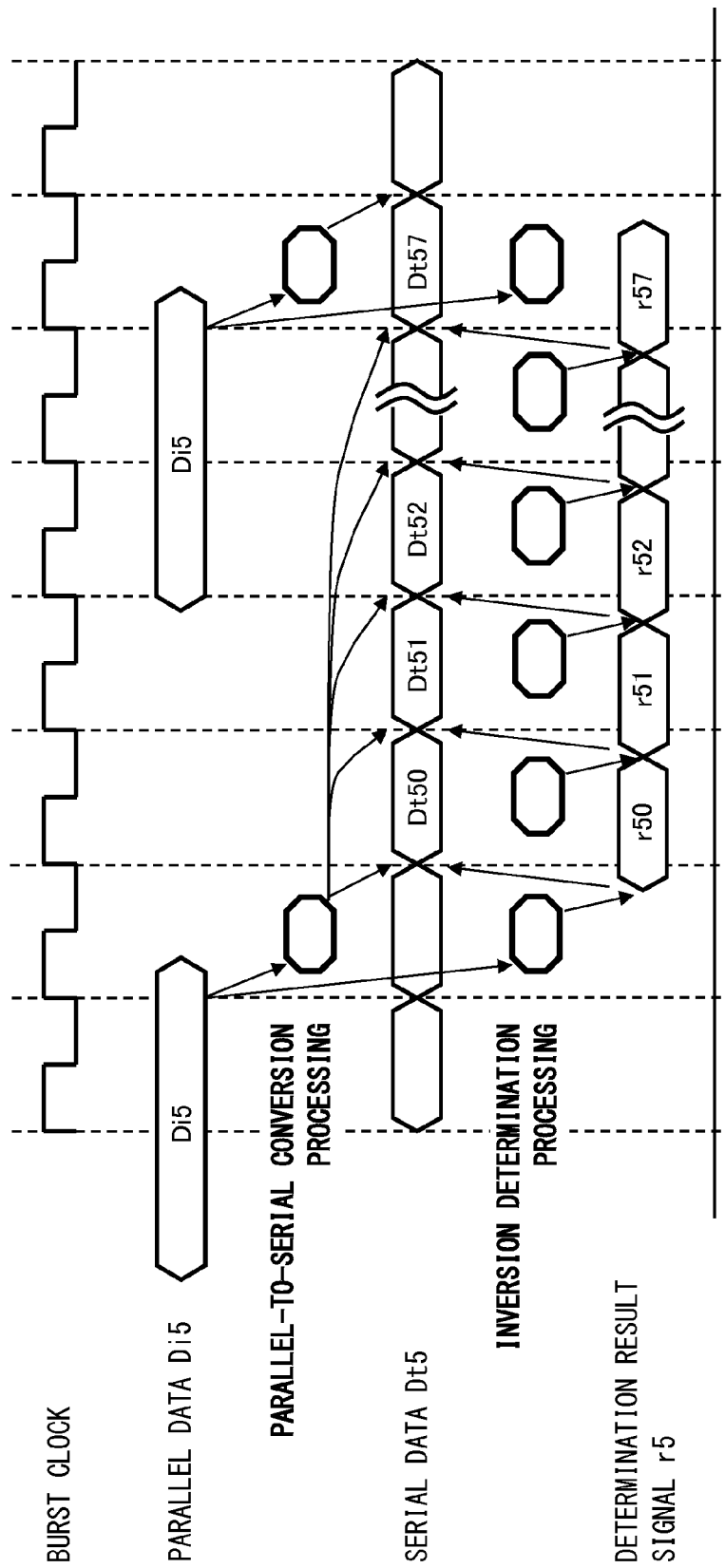
FIG. 9 is flowchart showing an operation of the semiconductor device shown in FIG. 8.

FIG. 9 is a timing diagram showing an operation of the semiconductor device 50.

As shown in FIG. 9, upon receiving the parallel data Di5, the parallel-to-serial conversion unit 512 performs processing for converting the parallel data Di5 into the serial data Da5. The inversion determination unit 513 executes processing in parallel with the parallel-to-serial conversion unit 512.

Specifically, the inversion determination unit 513 compares the burst data Di50 of the parallel data Di5, which has not been processed by the parallel-to-serial conversion unit 512, with the burst data Da57 which is provided one cycle before the data propagates through the data bus DBUS. Then the inversion determination unit 513 outputs the determination result signal r50 according to the comparison result.

The logic inversion unit 514 outputs, to the data bus DBUS, the burst data Da50, which is output from the conversion unit 512, or the inverted data of the burst data Da50, as data Dt50, based on the determination result signal r50.

During the period in which the parallel-to-serial conversion unit 512 outputs the burst data Da50, the inversion determination unit 513 compares the burst data Di51 of the parallel data Di5 with the burst data Dt50 which is provided one cycle before the data propagates through the data bus DBUS. Then the inversion determination unit 513 outputs a determination result signal r51 according to the comparison result.

When the parallel-to-serial conversion unit 512 starts outputting the subsequent burst data Da51, the logic inversion unit 514 outputs, to the data bus DBUS, the burst data Da51, which is output from the parallel-to-serial conversion unit 512, or the inverted data of the burst data Da51, as data Dt51, based on the determination result signal r51.

During the period in which the parallel-to-serial conversion unit 512 outputs the burst data Da51, the inversion determination unit 513 compares the burst data Di52 of the parallel data Di5 with the burst data Dt51 which is provided one cycle before the data propagates through the data bus DBUS. Then the inversion determination unit 513 outputs a determination result signal r52 according to the comparison result.

When the parallel-to-serial conversion unit 512 starts outputting the subsequent burst data Da52, the logic inversion unit 514 outputs, to the data bus DBUS, the burst data Da52, which is output from the parallel-to-serial conversion unit 512, or the inverted data of the burst data Da52, as data Dt52, based on the determination result signal r52. The above-described inversion determination processing is performed on each piece of burst data.

In this case, the inversion determination unit 513 determines whether or not to cause the logic inversion unit 514 to invert the serial data Da5, by using the parallel data Di5 which has not been processed by the parallel-to-serial conversion unit 512. In other words, the inversion determination unit 513 executes processing in parallel with the parallel-to-serial conversion unit 512, without waiting for the processing result from the parallel-to-serial conversion unit 512. Thus, the power consumption can be reduced without degrading the processing performance, unlike in the case where the inversion determination unit 513 executes processing after waiting for the processing result from the parallel-to-serial conversion unit 512.

Figure 10:
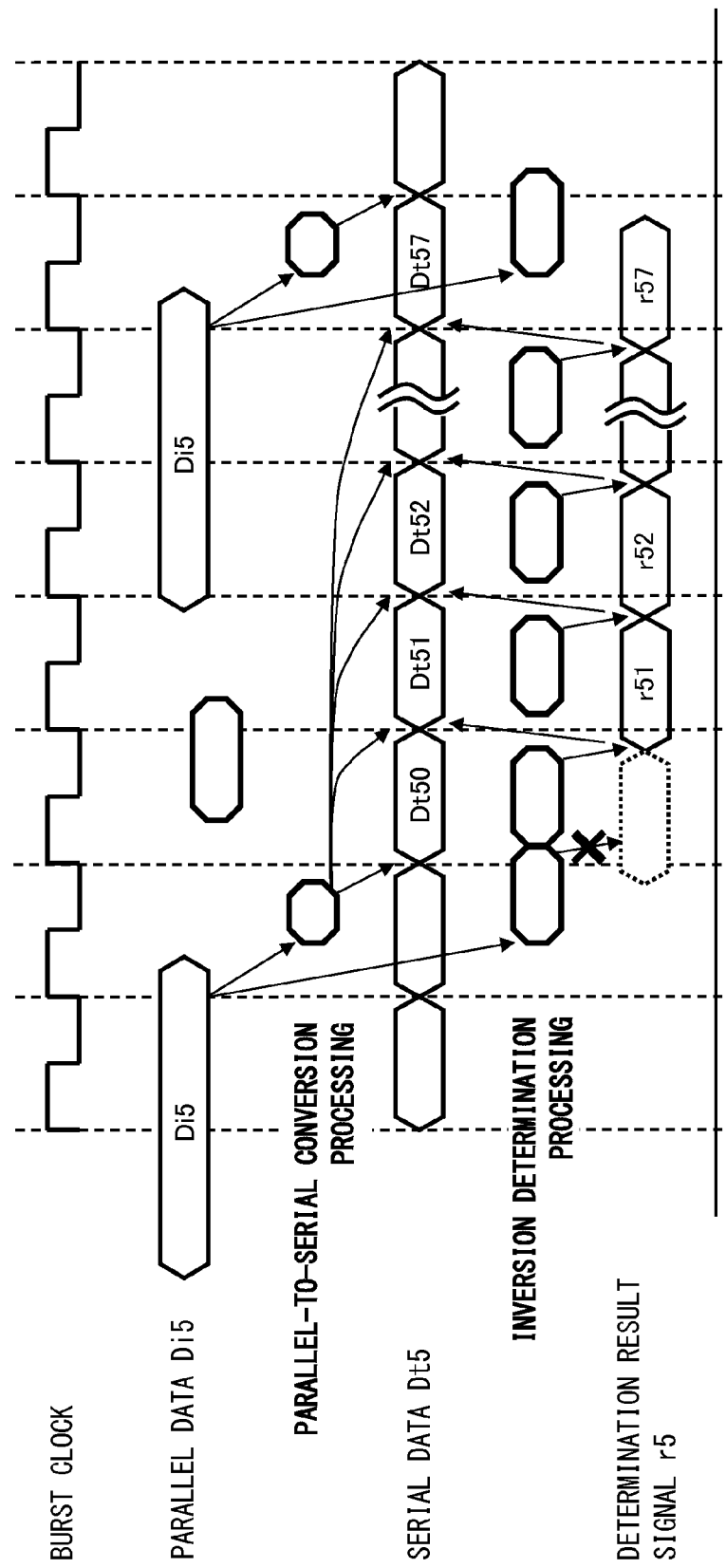
FIG. 10 is a flowchart showing an operation of the semiconductor device shown in FIG. 8.

As shown in FIG. 10, the processing in which the inversion determination unit 513 determines whether or not to invert the burst data Da50 may not be finished before completion of the conversion processing by the parallel-to-serial conversion unit 512. In such a case, the determination as to whether or not to invert the burst data Da50 is omitted.

In this case, an error of 1/8 is caused in the inversion determination in this embodiment. However, the error in the inversion determination decreases as the number of burst data increases.

In this manner, in the semiconductor device 50, the inversion determination unit 513 performs the inversion determination processing using the data, which has not been processed by the parallel-to-serial conversion unit 512, without waiting for the processing result from the parallel-to-serial conversion unit 512. Thus, the conversion processing performed by the parallel-to-serial conversion unit 512 and the processing performed by the inversion determination unit 513 can be executed in parallel, thereby making it possible to reduce power consumption without degrading the processing performance (processing speed).

<Sixth Embodiment>

Figure 11:
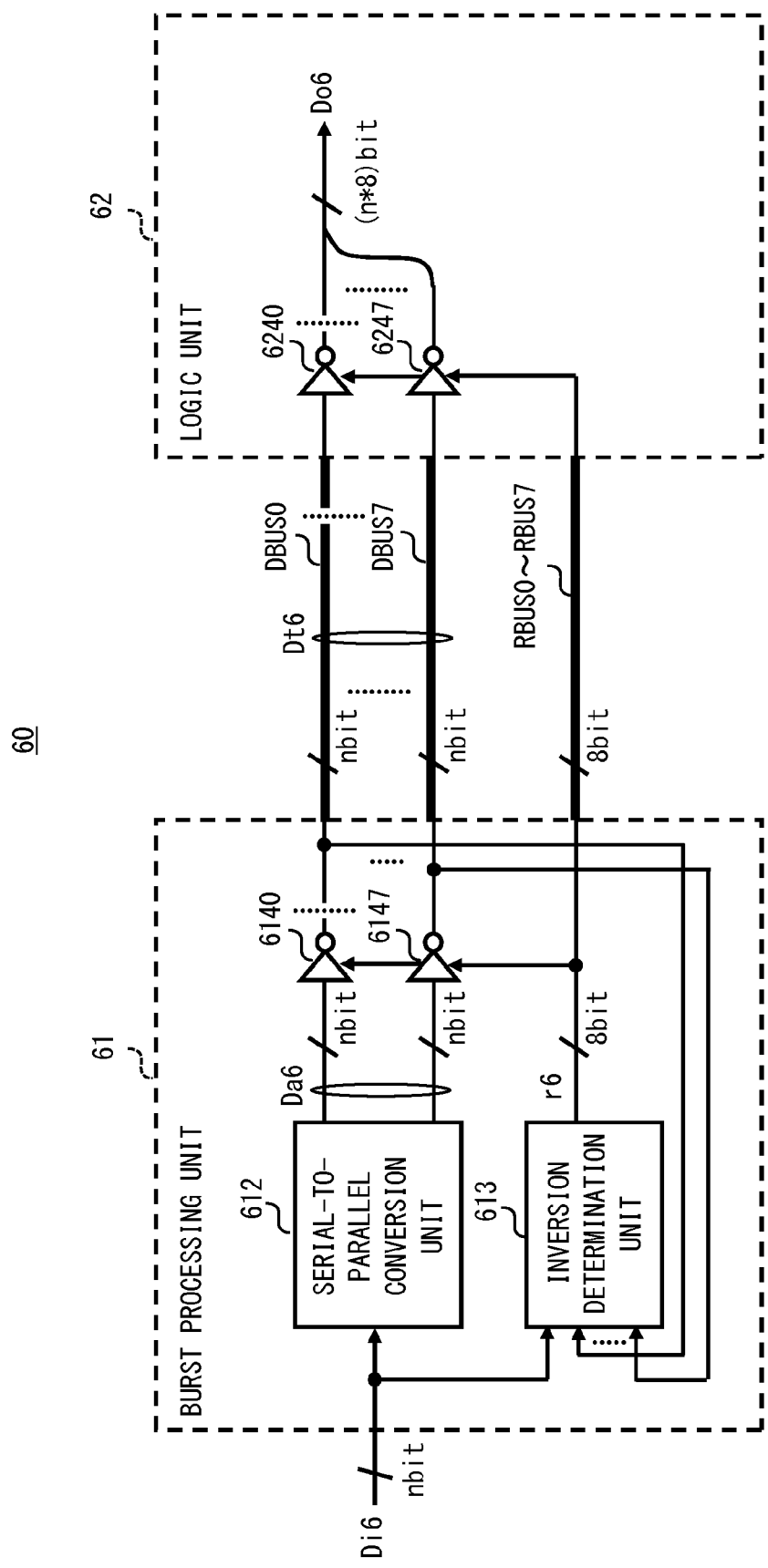
FIG. 11 is a block diagram showing a semiconductor device according to a sixth embodiment.

FIG. 11 is a block diagram showing a semiconductor device 60 according to a sixth embodiment. The semiconductor device 60 is a specific configuration example of the semiconductor device 40.

As shown in FIG. 11, the semiconductor device 60 includes a burst processing unit 61, a logic unit 62, and the buses DBUS and RBUS that connect the burst processing unit 61 and the logic unit 62 to each other. The data bus DBUS is formed of eight n-bit data buses DBUS0 to DBUS7. The data bus RBUS is formed of eight 1-bit data buses RBUS0 to RBUS7.

The burst processing unit 61 includes a serial-to-parallel conversion unit 612, an inversion determination unit 613, and a logic inversion unit 614 which is composed of eight logic inversion circuits 6140 to 6147.

The serial-to-parallel conversion unit 612 converts n-bit serial data Di6 into n×8-bit parallel data Da6. The serial data Di6 is formed of n-bit burst data Di60 to Di67 which are sequentially arranged in a serial format. The parallel data Da6 is formed of n-bit data Da60 to Da67.

The logic inversion unit 614 outputs, to the data bus DBUS, the parallel data Da6 or the inverted data thereof as data Dt6 based on a determination result signal r6 from the inversion determination unit 613. More specifically, the logic inversion circuits 6140 to 6147 respectively output the data Da60 to Da67 or the inverted data thereof as data Dt60 to Dt67 to the data buses DBUS0 to DBUS7 based on determination result signals r60 to r67.

The inversion determination unit 613 compares a part (for example, the burst data Di60) of the serial data Di6, which has not been processed by the serial-to-parallel conversion unit 612, with a part (for example, burst data Dt60 which is a part of the previous parallel data Dt6) of the parallel data which is output from the logic inversion unit 614 and propagates through the data bus DBUS, and outputs the determination result signal r6 according to the comparison result. The determination result signal r6 is formed of the 1-bit determination result signals r60 to r67.

The logic unit 62 includes a logic inversion unit 624 which is composed of eight logic inversion circuits 6240 to 6247. The logic inversion unit 624 outputs, as parallel data Do6, the parallel data Dt6, which is transmitted from the burst processing unit 61 through the data bus DBUS, or the inverted data of the parallel data Dt6, based on the determination result signal r6 transmitted from the burst processing unit 61 through the data bus RBUS.

Figure 12:
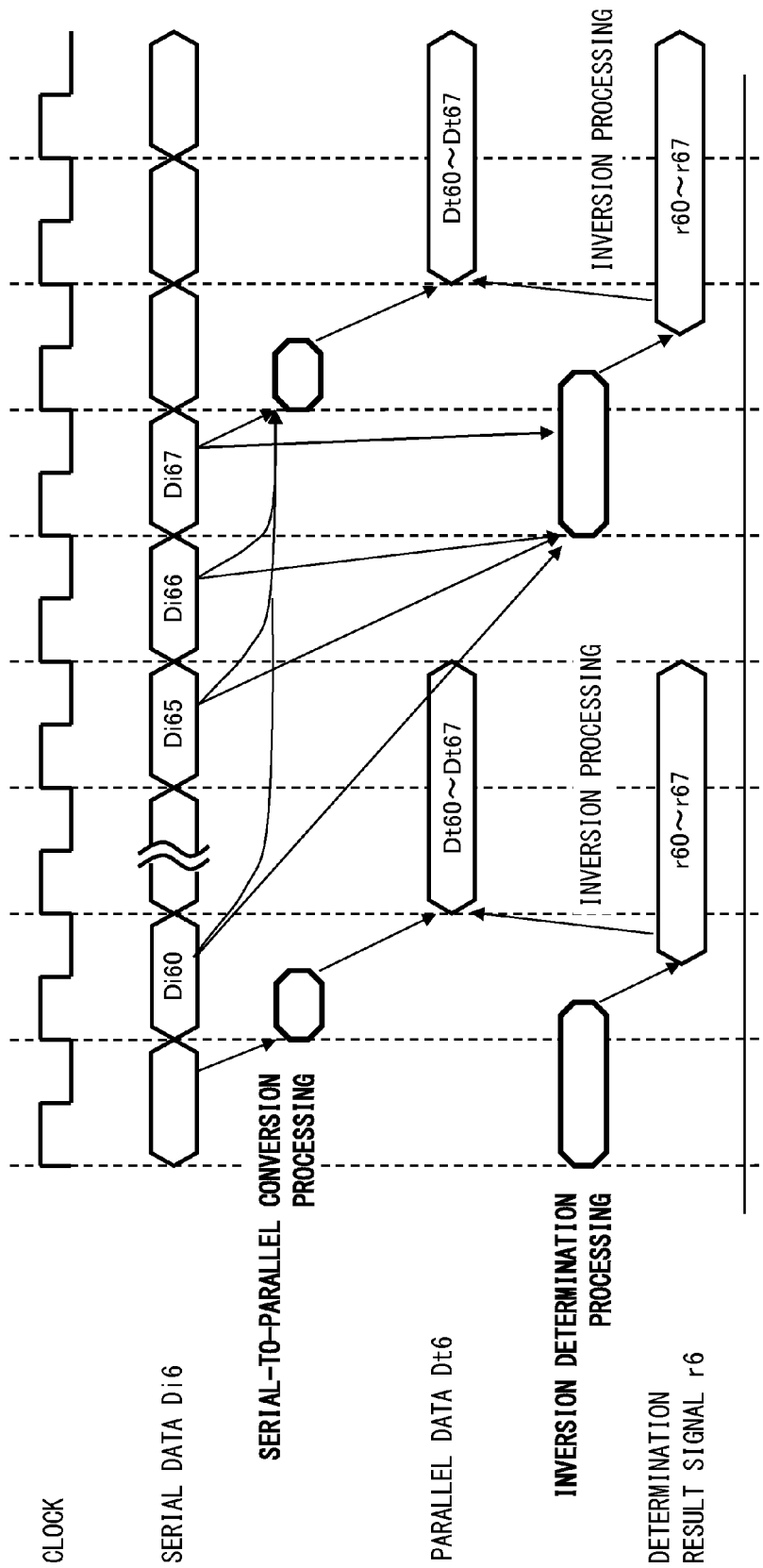
FIG. 12 is a flowchart showing an operation of the semiconductor device shown in FIG. 11.

FIG. 12 is a timing diagram showing an operation of the semiconductor device 60.

As shown in FIG. 12, upon receiving all the burst data Di60 to Di67 constituting the serial data Di6, the serial-to-parallel conversion unit 612 performs processing for converting the serial data Di6 into the parallel data Da6. The inversion determination unit 613 executes processing in parallel with the serial-to-parallel conversion unit 612.

Specifically, the inversion determination unit 613 compares the burst data Di60 of the serial data Di6, which has not been processed by the serial-to-parallel conversion unit 612, with the burst data Dt60 which propagates through the data bus DBUS0. Then the inversion determination unit 613 outputs the determination result signal r60 according to the comparison result.

Similarly, the inversion determination unit 613 compares the burst data Di61 to Di67 of the serial data Di6, which have not been processed by the serial-to-parallel conversion unit 612, with the burst data Dt61 to Dt67, which propagate through the data buses DBUS1 to DBUS7, respectively. Then the inversion determination unit 613 outputs the determination result signals r61 to r67 according to the comparison results.

The logic inversion circuits 6140 to 6147, which constitute the logic inversion unit 614, respectively output the burst data Da60 to Da67, which are output from the serial-to-parallel conversion unit 612, or the inverted data thereof, as the burst data Dt60 to Dt67 (that is, the parallel data Dt6) to the data bus DBUS0 to DBUS7 based on the determination result signals r60 to r67.

In this case, the inversion determination unit 613 determines whether or not to cause the logic inversion unit 614 to invert the parallel data Da6, by using the serial data Di6 which has not been processed by the serial-to-parallel conversion unit 612. In other words, the inversion determination unit 613 executes processing in parallel with the serial-to-parallel conversion unit 612, without waiting for the processing result from the serial-to-parallel conversion unit 612. Thus, the power consumption can be reduced without degrading the processing performance, unlike in the case where the inversion determination unit 613 executes processing after waiting for the processing result from the serial-to-parallel conversion unit 612.

Figure 13:
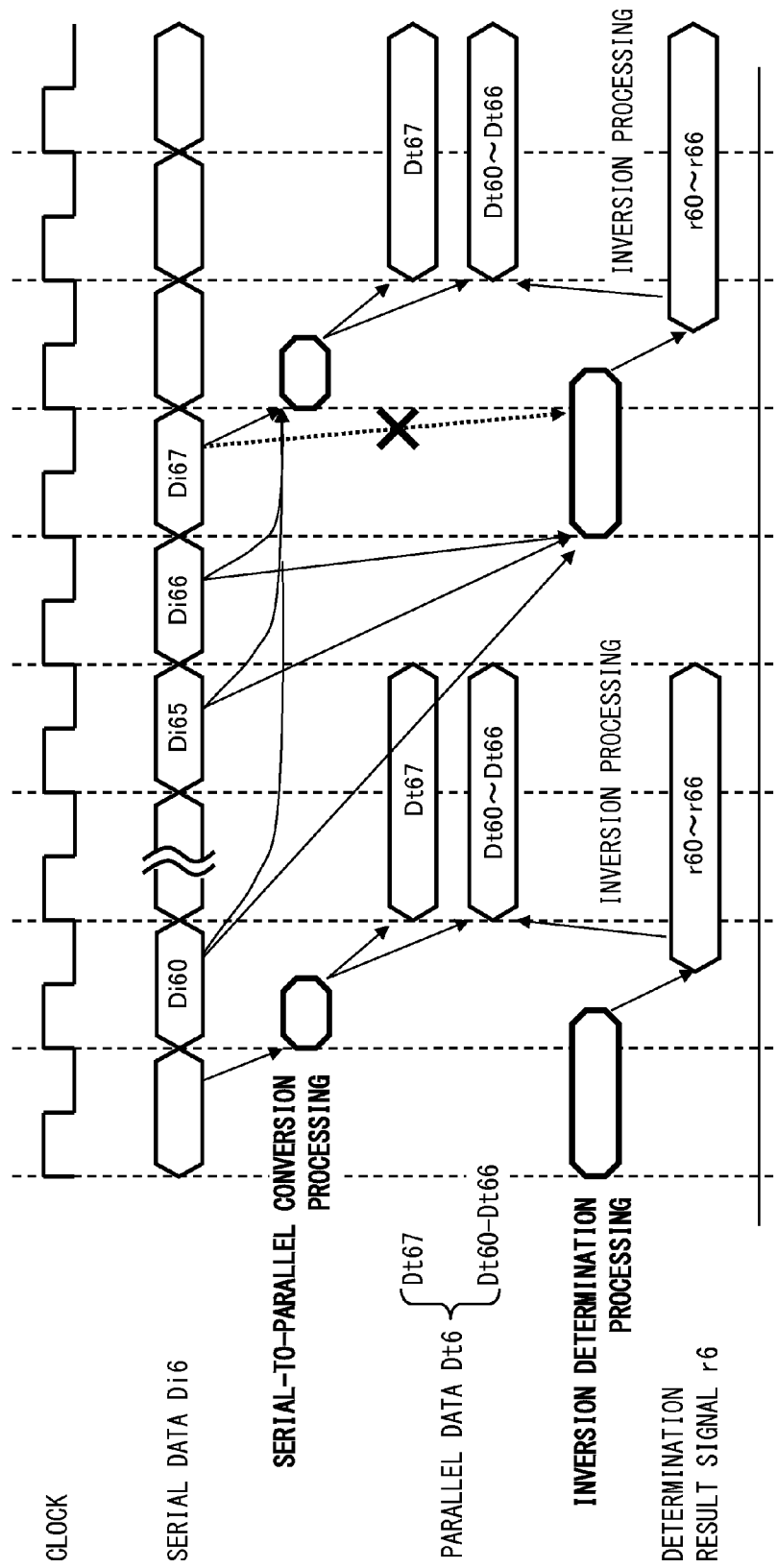
FIG. 13 is a flowchart showing an operation of the semiconductor device shown in FIG. 11.

As shown in FIG. 13, the inversion determination unit 613 can execute one inversion determination processing corresponding to the burst data Da60 to Da67 every time one of the burst data Di60 to Di67 is input. However, the processing in which the inversion determination unit 613 determines whether or not to invert the last burst data Da67 may not be finished before completion of the conversion processing by the serial-to-parallel conversion unit 612. In such a case, the determination as to whether or not to invert the burst data Da67 is omitted. In this case, an error of 1/8 is caused in the inversion determination in this embodiment. However, the error in the inversion determination decreases as the number of burst data increases.

In this manner, in the semiconductor device 60, the inversion determination unit 613 performs the inversion determination processing using the data, which has not been processed by the serial-to-parallel conversion unit 612, without waiting for the processing result from the serial-to-parallel conversion unit 612. Thus, the conversion processing performed by the serial-to-parallel conversion unit 612 and the processing performed by the inversion determination unit 613 can be executed in parallel, thereby making it possible to reduce power consumption without degrading the processing performance (processing speed).

<Seventh Embodiment>

Figure 14:
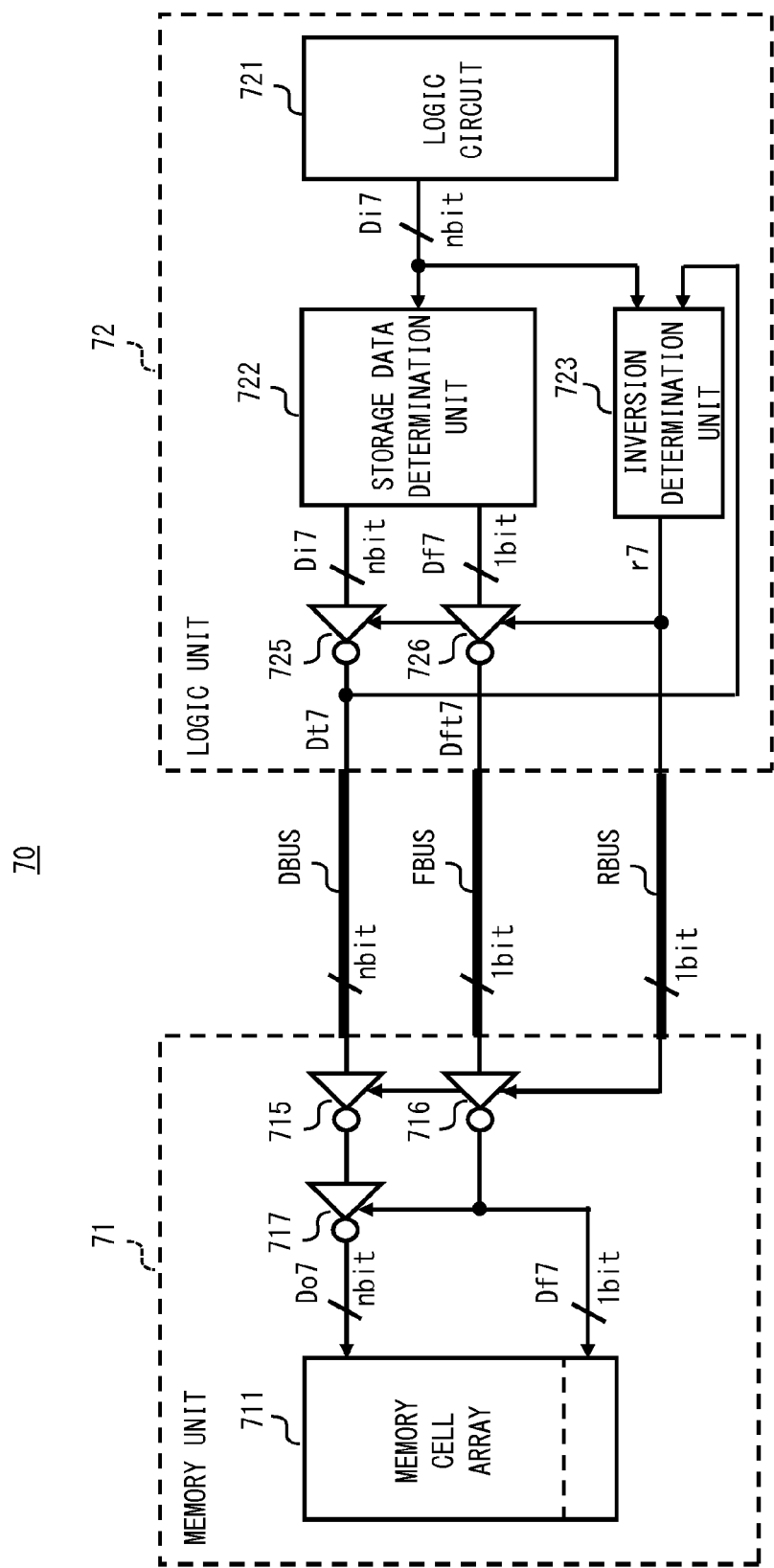
FIG. 14 is a block diagram showing a semiconductor device according to a seventh embodiment.

FIG. 14 is a block diagram showing a semiconductor device 70 according to a seventh embodiment. The semiconductor device 70 is a specific configuration example of the semiconductor device 40.

As shown in FIG. 14, the semiconductor device 70 includes a memory unit 71, a logic unit 72, and the buses DBUS, FBUS, and RBUS that connect the memory unit 71 and the logic unit 72 to each other. The data bus FBUS is a 1-bit width bus through which an inversion flag signal propagates.

The logic unit 72 includes a logic circuit 721, a storage data determination unit 722, an inversion determination unit 723, and logic inversion units 725 and 726. The logic circuit 721, the inversion determination unit 723, and the logic inversion units 725 and 726 respectively correspond to the logic circuit 221, the inversion determination unit 223, and the logic inversion units 225 and 226.

The logic circuit 721 outputs data Di7 to be written into the memory unit 71. The storage data determination unit 722 determines whether or not to invert the data Di7 to be written into the memory unit 71, and outputs an inversion flag signal Df7 and the write data Di7 in synchronization based on the determination result. The logic inversion unit 725 outputs, to the data bus DBUS, the data Di7 or the inverted data thereof as data Dt7 based on a determination result signal r7. The logic inversion unit 726 outputs, to the data bus FBUS, the inversion flag signal Df7 or the inverted data thereof as an inversion flag signal Dft7 based on the determination result signal r7.

In the plurality of bits constituting the data Di7 to be written into the memory unit 71, for example, when the number of bits representing the logical value 1 is greater than the number of bits representing the logical value 0, the storage data determination unit 722 brings (raises) the inversion flag signal into the H level. In the other cases, the storage data determination unit 722 brings the inversion flag signal into the L level.

The inversion determination unit 723 compares the data Di7, which has not been processed by the storage data determination unit 722, with the data Dt7 which is output from the logic inversion unit 725 and is provided one cycle before the data propagates through the data bus DBUS, and outputs the determination result signal r7 according to the comparison result.

The memory unit 71 includes a memory cell array 711 and logic inversion units 715 to 717. The memory cell array 711 and the logic inversion units 715 and 716 respectively correspond to the memory cell array 211 and the logic inversion units 215 and 216. A case will be described in which the current consumption required for retaining the data representing the logical value 1 is larger than the current consumption required for retaining the data representing the logical value 0, or the data retention performance required for retaining the data representing the logical value 1 is lower than the data retention performance required for retaining the data representing the logical value 0, in the data stored in the memory cell array 711.

The logic inversion unit 715 outputs, as data Do7, the data Dt7, which is transmitted from the logic unit 72 through the data bus DBUS, or the inverted data of the data Dt7, based on the determination result signal r7 transmitted from the logic unit 72 through the bus RBUS.

The logic inversion unit 716 outputs, as the inversion flag signal Df7, the inversion flag signal Dft7, which is transmitted from the logic unit 72 through the data bus FBUS, or the inverted data thereof, based on the determination result signal r7 transmitted from the logic unit 72 through the bus RBUS.

The logic inversion unit 717 outputs the data Do7 or the inverted data thereof based on the inversion flag signal Df7. The inversion flag signal Df7 and the data Do7, which are output from the logic inversion units 716 and 717, respectively, are written into the memory cell array 711.

In the plurality of bits constituting the data Do7 to be written into the memory cell array 711, the number of bits representing the logical value 1 can be suppressed to half or less. Therefore, the current consumption can be reduced and the data retention performance can be improved.

In this case, the inversion determination unit 723 determines whether or not to cause the logic inversion unit 725 to invert the data Di7, by using the data Di7 which has not been processed by the storage data determination unit 722. In other words, the inversion determination unit 723 executes processing in parallel with the storage data determination unit 722, without waiting for the processing result from the storage data determination unit 722. Thus, the power consumption can be reduced without degrading the processing performance, unlike in the case where the inversion determination unit 723 executes processing after waiting for the processing result from the storage data determination unit 722.

The seventh embodiment has illustrated a case in which the current consumption required for retaining the data representing the logical value 1 is larger than the current consumption required for retaining the data representing the logical value 0, or the data retention performance required for retaining the data representing the logical value 1 is lower than the data retention performance required for retaining the data representing the logical value 0, in the data stored in the memory cell array 711. However, the present invention is not limited thereto. In the data stored in the memory cell array 711, the current consumption required for retaining the data representing the logical value 0 may be larger than the current consumption required for retaining the data representing the logical value 1, or the data retention performance required for retaining the data representing the logical value 0 may be lower than the data retention performance required for retaining the data representing the logical value 1. In any case, it is only necessary to perform the inversion processing so that the number of bits of data representing a logical value at which the amount of current consumption required for retaining the data is larger, or at which the data retention performance required for retaining the data is lower, becomes equal to or less than a half of the number of bits of data stored in the memory cell array 711.

<Eighth Embodiment>

Figure 15:
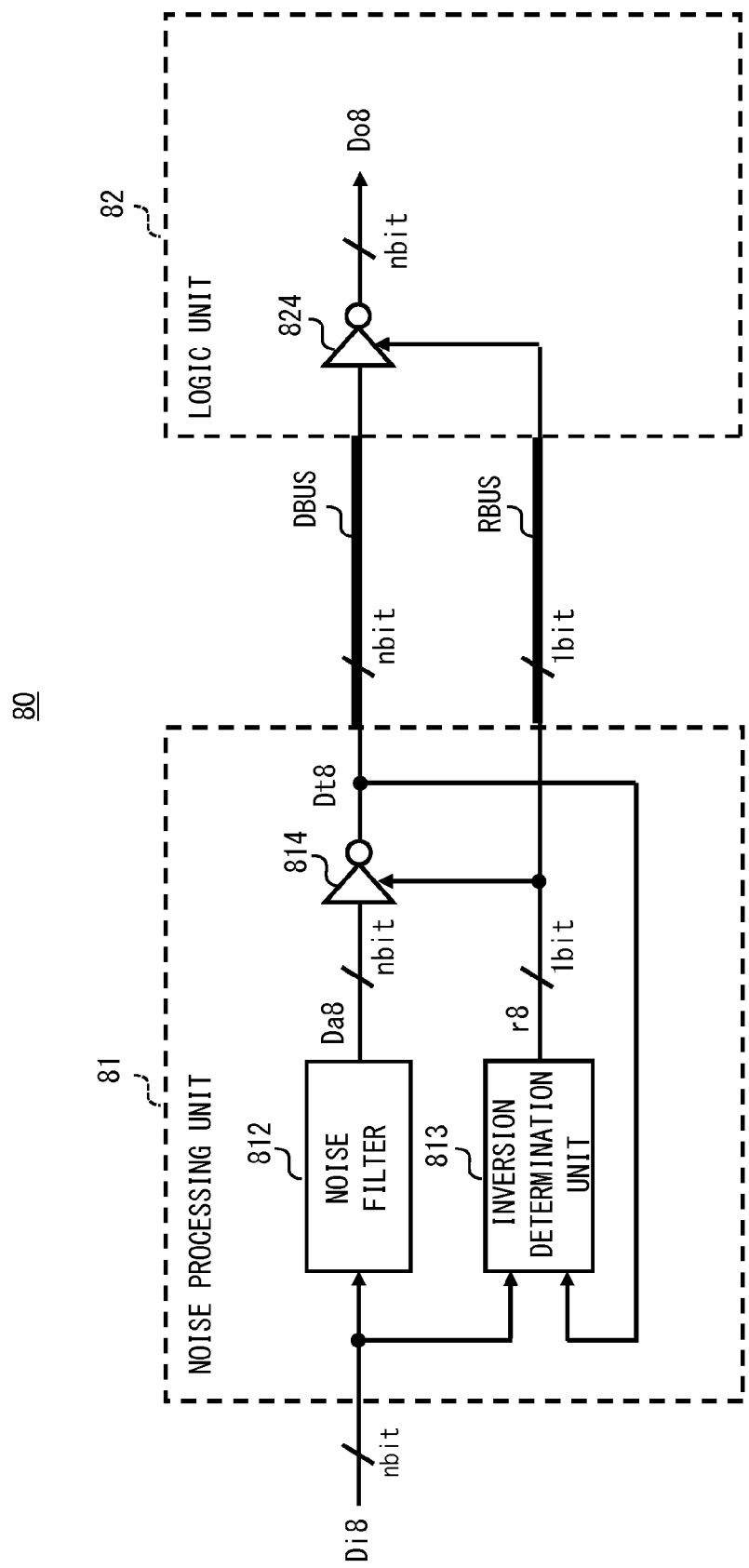
FIG. 15 is a block diagram showing a semiconductor device according to an eighth embodiment.

FIG. 15 is a block diagram showing a semiconductor device 80 according to an eighth embodiment. The semiconductor device 80 is a specific configuration example of the semiconductor device 40.

As shown in FIG. 15, the semiconductor device 80 includes a noise processing unit 81, a logic unit 82, and the buses DBUS and RBUS that connect the noise processing unit 81 and the logic unit 82 to each other. The noise processing unit 81 and the logic unit 82 correspond to the transmission unit 41 and the reception unit 42, respectively.

The noise processing unit 81 includes a noise filter 812, an inversion determination unit 813, and a logic inversion unit 814. The logic unit 82 includes a logic inversion unit 824. The noise filter 812, the inversion determination unit 813, the logic inversion unit 814, and the logic inversion unit 824 respectively correspond to the processing circuit 412, the inversion determination unit 413, the logic inversion unit 414, and the logic inversion unit 424.

That is, the semiconductor device 80 has a configuration in which the processing circuit 412 in the semiconductor device 40 is replaced by the noise filter 812. The other components of the semiconductor device 80 are similar to those of the semiconductor device 40, and thus the description thereof is omitted.

In this case, the inversion determination unit 813 determines whether or not to cause the logic inversion unit 814 to invert data Da8, by using data Di8 which has not been processed by the noise filter 812. In other words, the inversion determination unit 813 executes processing in parallel with the noise filter 812, without waiting for the processing result from the noise filter 812. Accordingly, if the error in the inversion determination using the data Di8, which has not been processed by the noise filter 812, is small, the power consumption can be reduced without degrading the processing performance, unlike in the case where the inversion determination unit 813 executes processing after waiting for the processing result from the noise filter 812.

<Ninth Embodiment>

Figure 16:
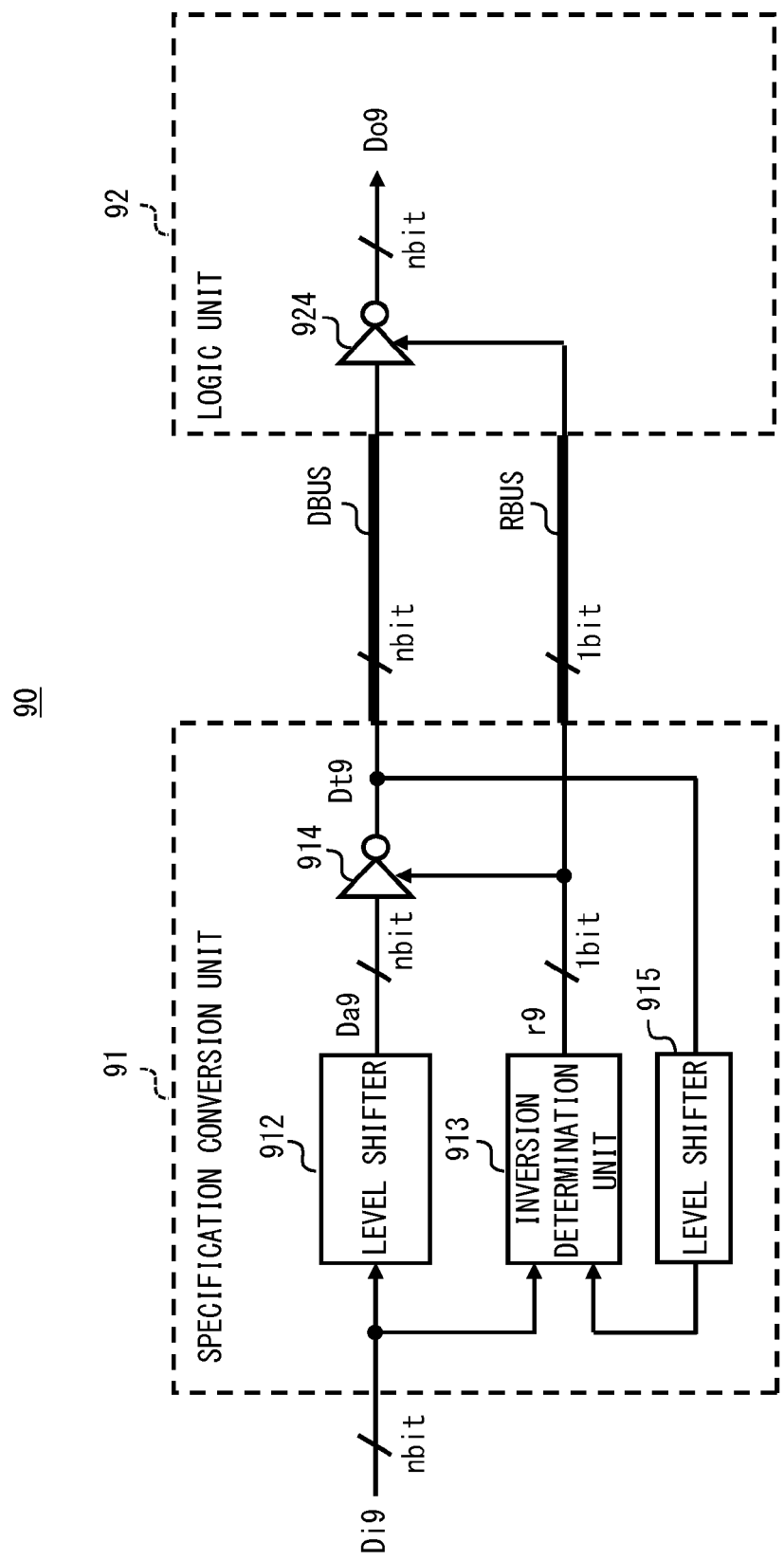
FIG. 16 is a block diagram showing a semiconductor device according to a ninth embodiment.

FIG. 16 is a block diagram showing a semiconductor device 90 according to a ninth embodiment. The semiconductor device 90 is a specific configuration example of the semiconductor device 40.

A shown in FIG. 16, the semiconductor device 90 includes a specification conversion unit 91, a logic unit 92, and the buses DBUS and RBUS that connect the specification conversion unit 91 and the logic unit 92 to each other. The specification conversion unit 91 and the logic unit 92 correspond to the transmission unit 41 and the reception unit 42, respectively.

The specification conversion unit 91 is a unit that converts the specification of a logic signal and outputs the converted signal. This embodiment illustrates an example in which data is output after the voltage amplitude of the data is converted. However, the method of converting the specification of a logic signal is not limited thereto. Other specification conversion methods, such as changing a termination processing method in a long wiring transmission system, a conversion into differential signals, and a conversion into multi-valued logic signals, may be employed.

The specification conversion unit 91 includes a level shifter 912, an inversion determination unit 913, a logic inversion unit 914, and a level shifter 915. The level shifter 912 changes the voltage amplitude of data Di9 and outputs the changed data as data Da9. The level shifter 915 restores the voltage amplitude of the data output from the logic inversion unit 914 to the voltage amplitude that has not been converted by the level shifter 912. The level shifter 912, the inversion determination unit 913, and the logic inversion unit 914 correspond to the processing circuit 412, the inversion determination unit 413, and the logic inversion unit 414, respectively.

The inversion determination unit 913 compares the data Di9, which has not been processed by the level shifter 912, with data obtained by restoring the voltage amplitude of data Dt9, which is output from the logic inversion unit 914 and is provided one cycle before the data propagates through the data bus DBUS, to the voltage amplitude that has not been converted by the level shifter 915. After that, the inversion determination unit 193 outputs a determination result signal r9 according to the comparison result.

That is, the semiconductor device 90 has a configuration in which the processing circuit 412 in the semiconductor device 40 is replaced by the level shifter 912 and the level shifter 915 that restores the voltage amplitude of data output from the logic inversion unit 914 to the voltage amplitude before conversion is added. The other components of the semiconductor device 90 are similar to those of the semiconductor device 40, and thus the description thereof is omitted.

In this case, the inversion determination unit 913 determines whether or not to cause the logic inversion unit 914 to invert the data Da9, by using the data Di9 which has not been processed by the level shifter 912. In other words, the inversion determination unit 913 executes processing in parallel with the level shifter 912, without waiting for the processing result from the level shifter 912. Thus, the power consumption can be reduced without degrading the processing performance, unlike in the case where the inversion determination unit 913 executes processing after waiting for the processing result from the level shifter 912.

As described above, it is necessary to restore the voltage amplitude of the data Dt9, which is input to the inversion determination unit 913, to the voltage amplitude before conversion, by using the level shifter 915. In this case, however, no delay is caused because the processing performed by the level shifter 915 is data processing in association with the previous cycle.

As described above, the semiconductor devices according to the first to ninth embodiments perform processing for determining whether or not to invert the data to be transmitted to the data bus, by using the data which has not been processed by the processing circuit, without waiting for the processing result from the processing circuit such as the ECC decoding unit. With this configuration, the processing performed by the processing circuit and the processing for determining whether or not to invert the data to be transmitted to the data bus can be executed in parallel, thereby making it possible to reduce power consumption without degrading the processing performance (processing speed).

The configurations of the semiconductor devices according to the above embodiments can also be applied to a data bus between a semiconductor chip incorporating a memory cell array and a system LSI having a logic function. In this case, the amount of current consumption per data bit is large, and thus the current reduction effect per data bit can be increased. Furthermore, the configurations of the semiconductor devices according to the above embodiments can also be applied to a technical connecting portion between multilayer chips, such as TSV. In this case, the data bit width can be increased, so that the current reduction effect can be further increased. In this manner, the configurations of the semiconductor devices according to the above embodiments can be developed and applied so as to reduce the amount of current in the design of a system or a module composed of a plurality of chips.

For example, in the semiconductor devices according to the embodiments described above, the conductivity type (p-type or n-type) of a semiconductor substrate, a semiconductor layer, a diffusion layer (diffusion region), and the like may be reversed. Accordingly, when one of the conductivity types of the n-type and the p-type is defined as a first conductivity type and the other conductivity type is defined as a second conductivity type, the first conductivity type may be the p-type and the second conductivity type may be the n-type. On the contrary, the first conductivity type may be the n-type and the second conductivity type may be the p-type.

The invention made by the present inventors has been described above with reference to embodiments. However, the present invention is not limited to the above embodiments, and can be modified in various manners without departing from the scope of the invention as a matter of course.

The first to ninth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A data bus driving circuit comprising:
    a data processing unit that processes input data and outputs processed data;
    a first logic inversion unit that selects, based on a determination result signal, one of the processed data and inverted data obtained by logically inverting each value of a plurality of bits constituting the processed data, and outputs the selected data to a data bus; and
    an inversion determination unit that compares the data output from the first logic inversion unit with the input data that has not been processed by the data processing unit, and outputs the determination result signal based on a comparison result.

2. The data bus driving circuit according to claim 1, wherein the inversion determination unit outputs the determination result signal to cause the inverted data to be output from the first logic inversion unit when a number of bits representing different logical values is greater than a number of bits representing a same logical value, as a result of comparing each value of a plurality of bits constituting the input data with each value of a plurality of bits constituting the data output from the first logic inversion unit.

3. The data bus driving circuit according to claim 2, wherein the inversion determination unit outputs the determination result signal to cause the processed data to be directly output from the first logic inversion unit when the number of bits representing different logical values is equal to or less than the number of bits representing the same logical value.

4. A semiconductor device, comprising:
    the data bus driving circuit according to claim 1; and
    a second logic inversion unit that restores the processed data by re-inverting the inverted data based on the determination result signal, the inverted data being transmitted through the data bus.

5. The data bus driving circuit according to claim 1, wherein the data processing unit serves as an Error Check and Correct (ECC) decoding unit that performs error correction processing on the input data based on an error correction code and outputs the corrected input data as the processed data, the input data being read out from a memory cell array.

6. A semiconductor memory device, comprising:
    the data bus driving circuit according to claim 5; and
    the memory cell array.

7. A semiconductor device, comprising:
    the semiconductor memory device according to claim 6;
    a logic unit; and
    the data bus that connects the semiconductor memory device with the logic unit,
    wherein the logic unit comprises:

a second logic inversion unit that restores the processed data by re-inverting, based on the determination result signal, the inverted data transmitted through the data bus; and a logic circuit that receives the processed data and executes predetermined processing.

8. A semiconductor memory device, comprising:

a memory cell array;

an Error Check and Correct (ECC) decoding unit that performs error correction processing, based on an error correction code, on data read out from the memory cell array, and outputs the corrected data;

a first logic inversion unit that selects, based on a determination result signal, one of the corrected data and inverted data obtained by logically inverting each value of a plurality of bits constituting the corrected data, and outputs the selected data to a data bus; and an inversion determination unit that compares the data output from the first logic inversion unit with the data that has not been corrected, and outputs the determination result signal based on a comparison result.

9. A semiconductor device, comprising:

the semiconductor memory device according to claim 8;

a logic unit; and the data bus that connects the semiconductor memory device with the logic unit, wherein the logic unit comprises:

a second logic inversion unit that restores the corrected data by re-inverting the inverted data based on the determination result signal, the inverted data being transmitted through the data bus; and a logic circuit that receives the corrected data and executes predetermined processing.

10. The data bus driving circuit according to claim 1, wherein the data processing unit comprises a parallel-to-serial conversion unit that converts the input data as parallel data to the processed data as serial data.

11. The data bus driving circuit according to claim 1, wherein the data processing unit comprises a serial-to-parallel conversion unit that converts the input data as serial data to the processed data as parallel data.

12. The data bus driving circuit according to claim 1, wherein the data processing unit serves as a storage data determination unit that outputs the input data to be written into a memory cell array as the processed data, and outputs an inversion flag signal for inverting the processed data when a number of bits representing a logical value 1 is greater than a number of bits representing a logical value 0 in a plurality of bits constituting the input data.

13. The data bus driving circuit according to claim 1, wherein the data processing unit comprises a noise filter.

14. The data bus driving circuit according to claim 1, wherein the data processing unit serves as a first level shifter that converts a voltage amplitude of the input data and outputs the input data as the processed data, wherein the data bus driving circuit further comprises a second level shifter that restores a voltage amplitude of the data output from the first logic inversion unit to a voltage amplitude that has not been converted by the data processing unit, and wherein the inversion determination unit compares data output from the second level shifter with the input data that has not been processed by the data processing unit, and outputs the determination result signal based on a comparison result.

15. The data bus driving circuit according to claim 1, wherein the inversion determination unit compares the input data that has not been processed by the data processing unit with the processed data to propagate through the data bus.

16. The data bus driving circuit according to claim 1, wherein the data processing unit serves as an Error Check and Correct (ECC) decoding unit that performs error correction processing on the input data based on an error correction code.

17. The data bus driving circuit according to claim 16, wherein the ECC decoding unit outputs the corrected input data as the processed data.

18. The data bus driving circuit according to claim 1, wherein the data bus connects the semiconductor memory device to a logic unit that comprises a second logic inversion unit that restores the processed data by re-inverting, based on the determination result signal, the inverted data transmitted through the data bus.

19. The data bus driving circuit according to claim 1, wherein the data processing unit serves as a storage data determination unit that outputs the input data to be written into a memory cell array as the processed data, and outputs an inversion flag signal for inverting the processed data.

20. The semiconductor memory device according to claim 8, wherein the inversion determination unit compares the data that has not been corrected by the ECC decoding unit with the corrected data to propagate through the data bus.

* * * * *